United States Patent
Kato et al.

(10) Patent No.: US 9,127,652 B2
(45) Date of Patent: Sep. 8, 2015

(54) METHOD AND APPARATUS FOR DRIVING A POLYMER ACTUATOR TO CONTROL A LENS

(75) Inventors: Yusaku Kato, Tokyo (JP); Takehisa Ishida, Tokyo (JP); Nobuyuki Nagai, Kanagawa (JP)

(73) Assignee: Sony Corporation, Tokyo (JP)

( * ) Notice: Subject to any disclaimer, the term of this patent is extended or adjusted under 35 U.S.C. 154(b) by 647 days.

(21) Appl. No.: 13/205,941

(22) Filed: Aug. 9, 2011

(65) Prior Publication Data

US 2012/0038815 A1 Feb. 16, 2012

(30) Foreign Application Priority Data

Aug. 16, 2010 (JP) ................. 2010-181716

(51) Int. Cl.
- *H04N 5/225* (2006.01)
- *F03G 7/00* (2006.01)
- *G02B 7/02* (2006.01)
- *G02B 7/10* (2006.01)
- *G02B 13/00* (2006.01)
- *H01L 41/09* (2006.01)
- *H01L 41/193* (2006.01)

(52) U.S. Cl.
CPC ............... *F03G 7/005* (2013.01); *G02B 7/026* (2013.01); *G02B 7/102* (2013.01); *G02B 13/0025* (2013.01); *H01L 41/0946* (2013.01); *H01L 41/193* (2013.01)

(58) Field of Classification Search
CPC .................................. H04N 5/2253
USPC ............................................ 348/374
See application file for complete search history.

(56) References Cited

U.S. PATENT DOCUMENTS

| 2005/0030408 | A1* | 2/2005 | Ito et al. ............... 348/340 |
| 2006/0261709 | A1 | 11/2006 | Kato et al. |
| 2007/0108890 | A1* | 5/2007 | Forrest ................ 313/504 |
| 2008/0144185 | A1* | 6/2008 | Wang et al. ............. 359/665 |
| 2010/0033835 | A1* | 2/2010 | Heim et al. ............. 359/683 |
| 2010/0171393 | A1 | 7/2010 | Pei et al. |

FOREIGN PATENT DOCUMENTS

| CN | 1967314 A | 5/2007 |
| CN | 101672972 A | 3/2010 |
| JP | 2006-172635 A | 6/2006 |
| JP | 2006-293006 A | 10/2006 |
| JP | 2008-216074 A | 9/2008 |
| JP | 2011-507036 A | 3/2011 |
| KR | 2005-0011243 A | 1/2005 |
| WO | WO 2009/076477 A1 | 6/2009 |
| WO | WO 2011/114435 A1 | 9/2011 |

\* cited by examiner

*Primary Examiner* — Usman Khan
(74) *Attorney, Agent, or Firm* — Wolf, Greenfield & Sacks, P.C.

(57) ABSTRACT

A driving unit that may improve characteristics in a low temperature environment while implementing downsizing, and a lens module as well as an image pickup device with such a driving unit are provided. The driving unit includes one or a plurality of polymer actuator elements, and a voltage supply section supplying a driving voltage and a heating voltage to the polymer actuator element.

18 Claims, 19 Drawing Sheets

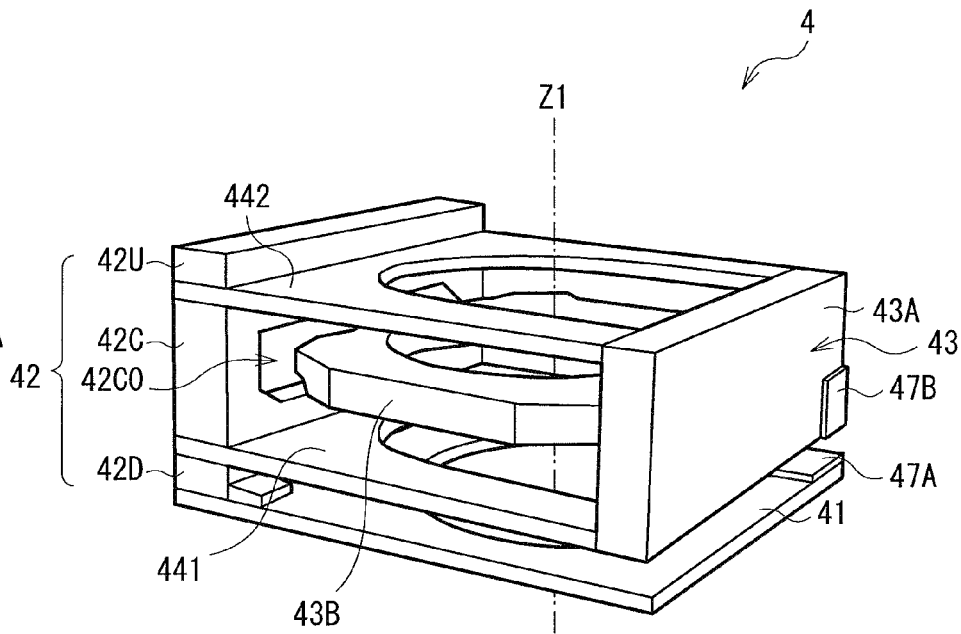
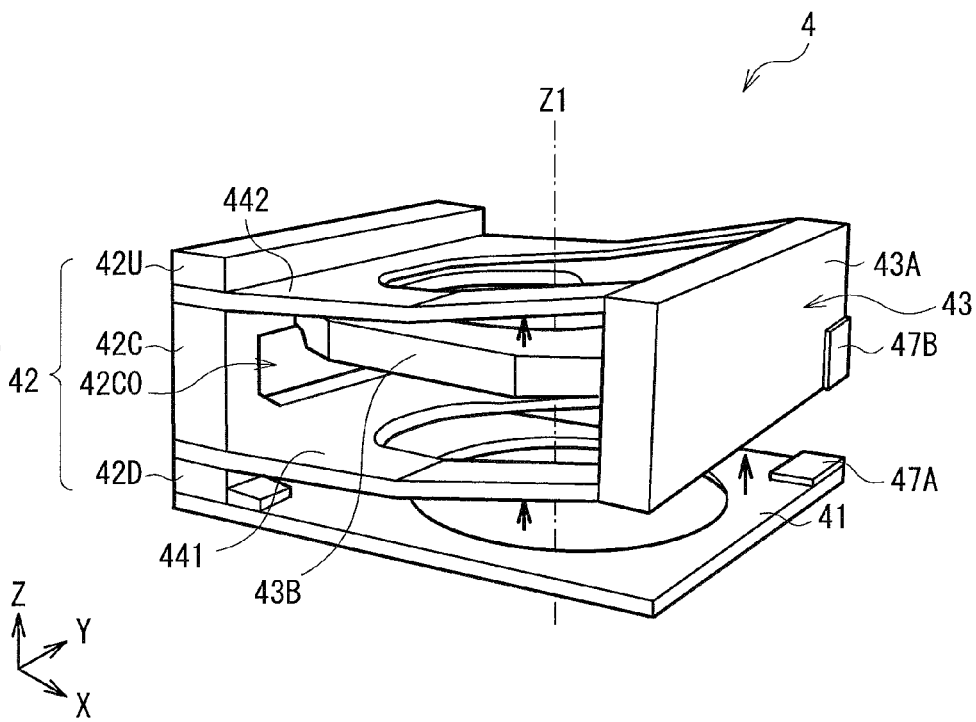

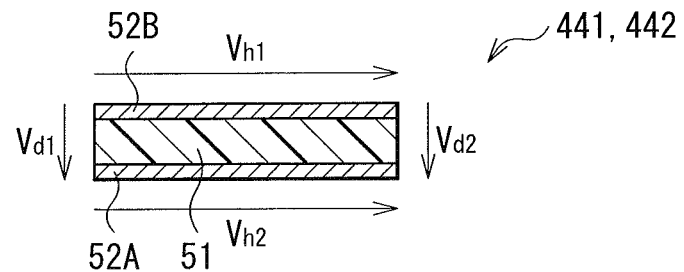
FIG. 14A
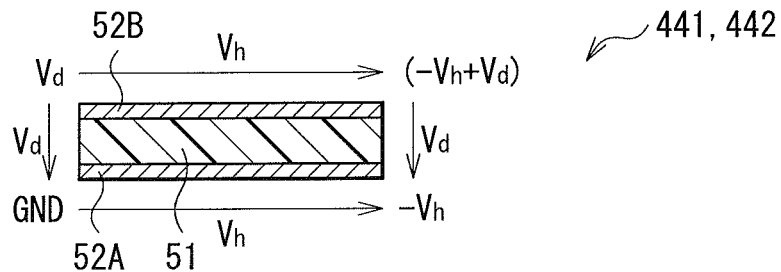
FIG. 14B
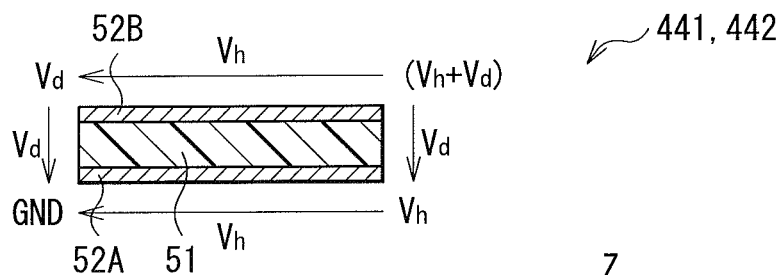
FIG. 14C
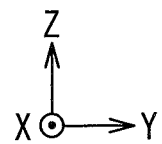

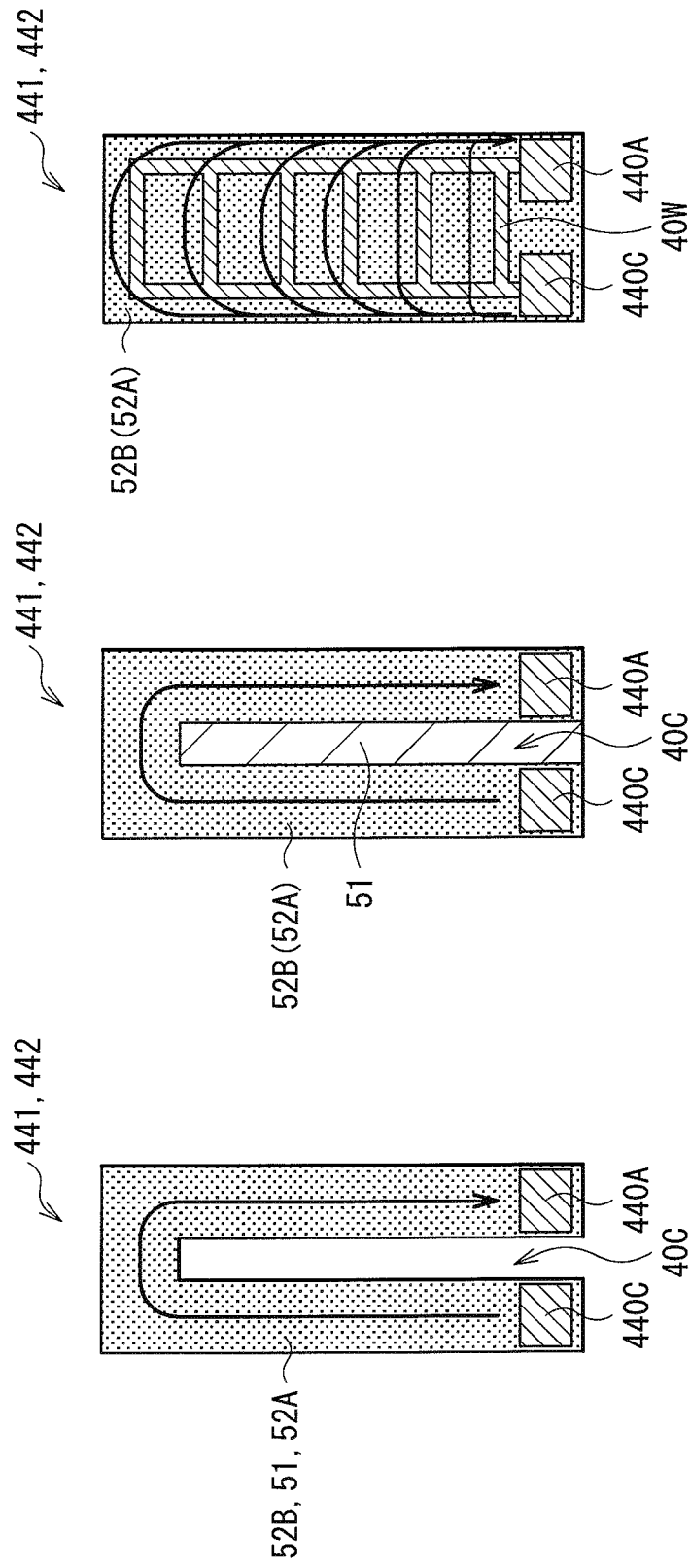

METHOD AND APPARATUS FOR DRIVING A POLYMER ACTUATOR TO CONTROL A LENS

BACKGROUND

The present disclosure relates to a driving unit using a polymer actuator element, and a lens module as well as an image pickup device with such a driving unit.

In recent years, for example, portable electronic devices such as a portable telephone, and a personal computer (PC), or a PDA (Personal Digital Assistant) have become remarkably multifunctional, and a portable electronic device equipped with a lens module thereby having an image pickup function has become common. In such a portable electronic device, focusing and zooming are performed by moving a lens in the lens module to an optical axis direction.

In general, a way of moving the lens in the lens module by using a voice coil motor or a stepping motor as a drive section is common. Meanwhile, recently, a device employing a polymer actuator element as a drive section has been developed from the viewpoint of miniaturization (see, for example, Japanese Unexamined Patent Application Publications No. 2006-293006 and No. 2006-172635). The polymer actuator element is an element in which, for example, an ion exchange resin film is interposed between a pair of electrodes. In this polymer actuator element, the ion exchange resin film is displaced in a direction orthogonal to a film surface, due to occurrence of a potential difference between the pair of electrodes.

SUMMARY

Incidentally, in such a polymer actuator element, in general, ion mobility in the ion exchange resin film mentioned above declines in a low temperature environment, compared to a room temperature environment. For this reason, in the low temperature environment, there is such a disadvantage that there occurs degradation (deterioration) in characteristics, such as a decline in the working speed of the polymer actuator element or a reduction in displacement, compared to the room temperature environment.

Thus, it is conceivable to provide a heat source (a heater or the like) outside, in order to improve the characteristics in the low temperature environment of such a polymer actuator element. However, provision of such a dedicated heat source separately makes a device configuration large (complicated).

In view of the foregoing, it is desirable to provide a driving unit that may improve characteristics in a low temperature environment while implementing downsizing, and a lens module as well as an image pickup device with such a driving unit.

According to an embodiment of the present disclosure, there is provided a driving unit including one or a plurality of polymer actuator elements, and a voltage supply section supplying a driving voltage and a heating voltage to the polymer actuator element.

Further, according to an embodiment of the present disclosure, there is provided a lens module including a lens, and the above-described driving unit driving the lens.

Furthermore, according to an embodiment of the present disclosure, there is provided an image pickup device including a lens, an image pickup element acquiring an image pickup signal of image formation by the lens, and the above-described driving unit driving the lens.

In the driving unit, the lens module, and the image pickup device according to the embodiment of the present disclosure, in addition to the driving voltage, the heating voltage is supplied to the polymer actuator element. Thus, the temperature of the element increases due to heat generation by the polymer actuator element itself, without a dedicated heat source being provided outside separately.

According to the driving unit, the lens module, and the image pickup device of the embodiment of the present disclosure, in addition to the driving voltage, the heating voltage is supplied to the polymer actuator element. Therefore, it is possible to increase the temperature of the element by heat generation of the polymer actuator element itself, and improve the working speed and the like of the element in a low temperature environment, without providing an external dedicated heat source separately. Accordingly, it is possible to improve characteristics in the low temperature environment, while implementing downsizing.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 9A and 9B are perspective diagrams for explaining operation of the lens module illustrated in FIG. 3.

FIGS. 14A to 14C are schematic diagrams for explaining a relationship between the driving voltage and the heating voltage.

FIGS. 17A to 17C are schematic diagrams each illustrating a configurational example of a polymer actuator element and a fixed electrode according to a modification 1.

DETAILED DESCRIPTION OF EMBODIMENTS

Figure 1:
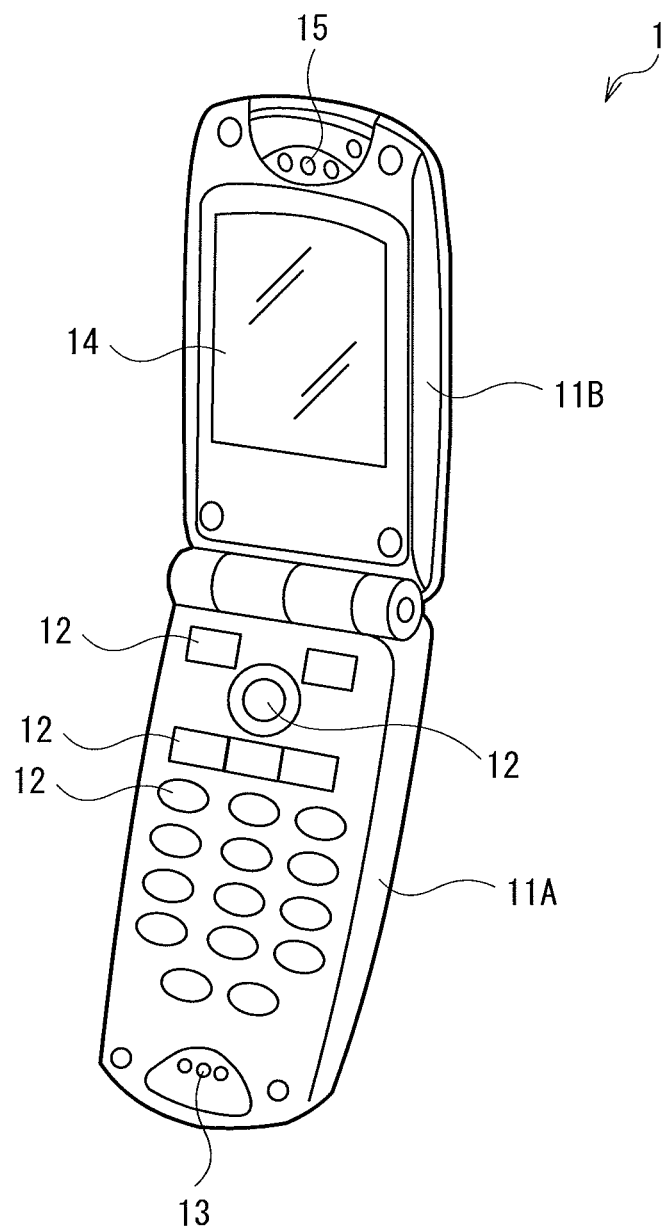
FIG. 1 is a perspective diagram illustrating a configurational example of an electronic device with an image pickup device according to an embodiment of the present disclosure.
Figure 2:
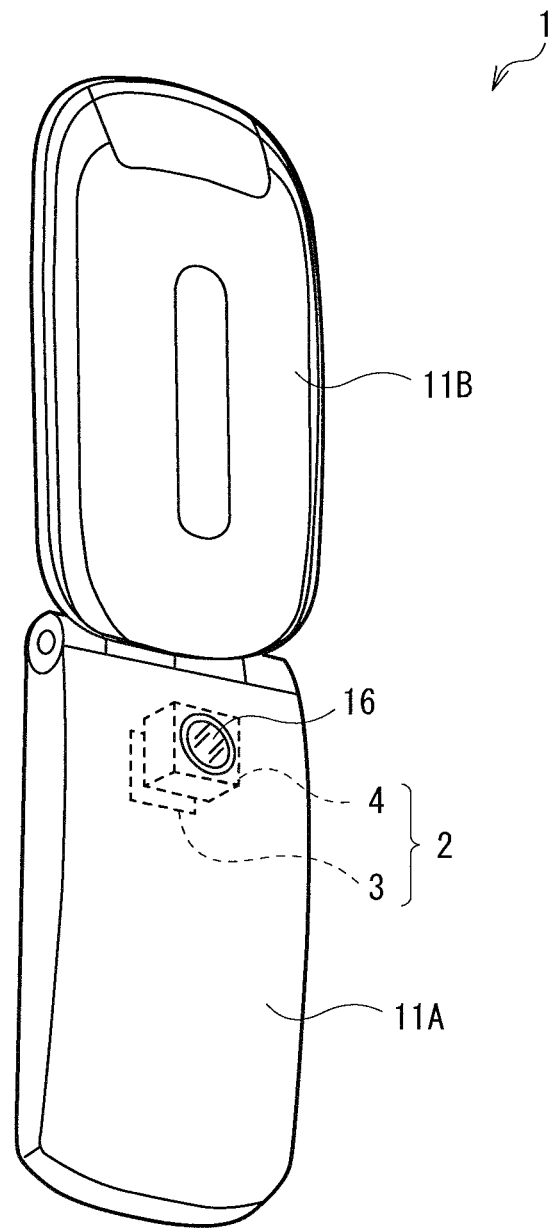
FIG. 2 is a perspective diagram illustrating the electronic device illustrated in FIG. 1, viewed from a different direction.

An embodiment of the present disclosure will be described below in detail with reference to the drawings. Incidentally, the description will be provided in the following order.
1. Embodiment (an example in which a heating voltage is selectively supplied to a fixed side in an electrode film of a polymer actuator element)
2. Modifications
   Modification 1 (an example 1 in which a heating voltage is supplied from a fixed side along a movable side in an electrode film of a polymer actuator element)
   Modification 2 (an example 2 in which a heating voltage is supplied from a fixed side along a movable side in an electrode film of a polymer actuator element)
   Modification 3 (an example in which a heating voltage is supplied between electrode films of a polymer actuator element)
[Embodiment]
Schematic Structure of Electronic Device with Image Pickup Device FIG. 1 and FIG. 2 are perspective diagrams illustrating a schematic structure of a portable telephone (a portable telephone 1) with an image pickup function, as an example of an electronic device with an image pickup device (an image pickup device 2 to be described later) according to an embodiment of the present disclosure. In this portable telephone 1, two housings 11A and 11B are foldably coupled together through a hinge mechanism not illustrated.

As illustrated in FIG. 1, in a surface on one side of the housing 11A, various operation keys 12 are disposed, and a microphone 13 is disposed below the operation keys 12. The operation keys 12 are intended to receive predetermined operation by a user and thereby input information. The microphone 13 is intended to input voice of the user during a call and the like.

As illustrated in FIG. 1, a display section 14 using a liquid-crystal display panel or the like is disposed in a surface on one side of the housing 11B, and a speaker 15 is disposed at an upper end thereof. The display section 14 displays various kinds of information such as a radio-wave receiving status, a remaining battery, a telephone number of a party on the other end of the line, contents (telephone numbers, names, and the like of other parties) recorded as a telephone book, an outgoing call history, an incoming call history, and the like, for example. The speaker 15 is intended to output the voice of a party on the other end of the line during a call and the like.

As illustrated in FIG. 2, a cover glass 16 is disposed in a surface on the other side of the housing 11A, and the image pickup device 2 is provided at a position corresponding to the cover glass 16 in the housing 11A. This image pickup device 2 is configured to include a lens module 4 disposed on an object side (the cover glass 16 side), and an image pickup element 3 disposed on an image pickup side (inside of the housing 11A). The image pickup element 3 is an element that obtains an image pickup signal of image formation by a lens (a lens 48 to be described later) in the lens module 4. This image pickup element 3 is, for example, an image sensor mounted with a Charge Coupled Device (CCD), a Complementary Metal Oxide Semiconductor (CMOS), or the like.
(Configuration of Image Pickup Device 2 and Lens Module 4)

Figure 3:
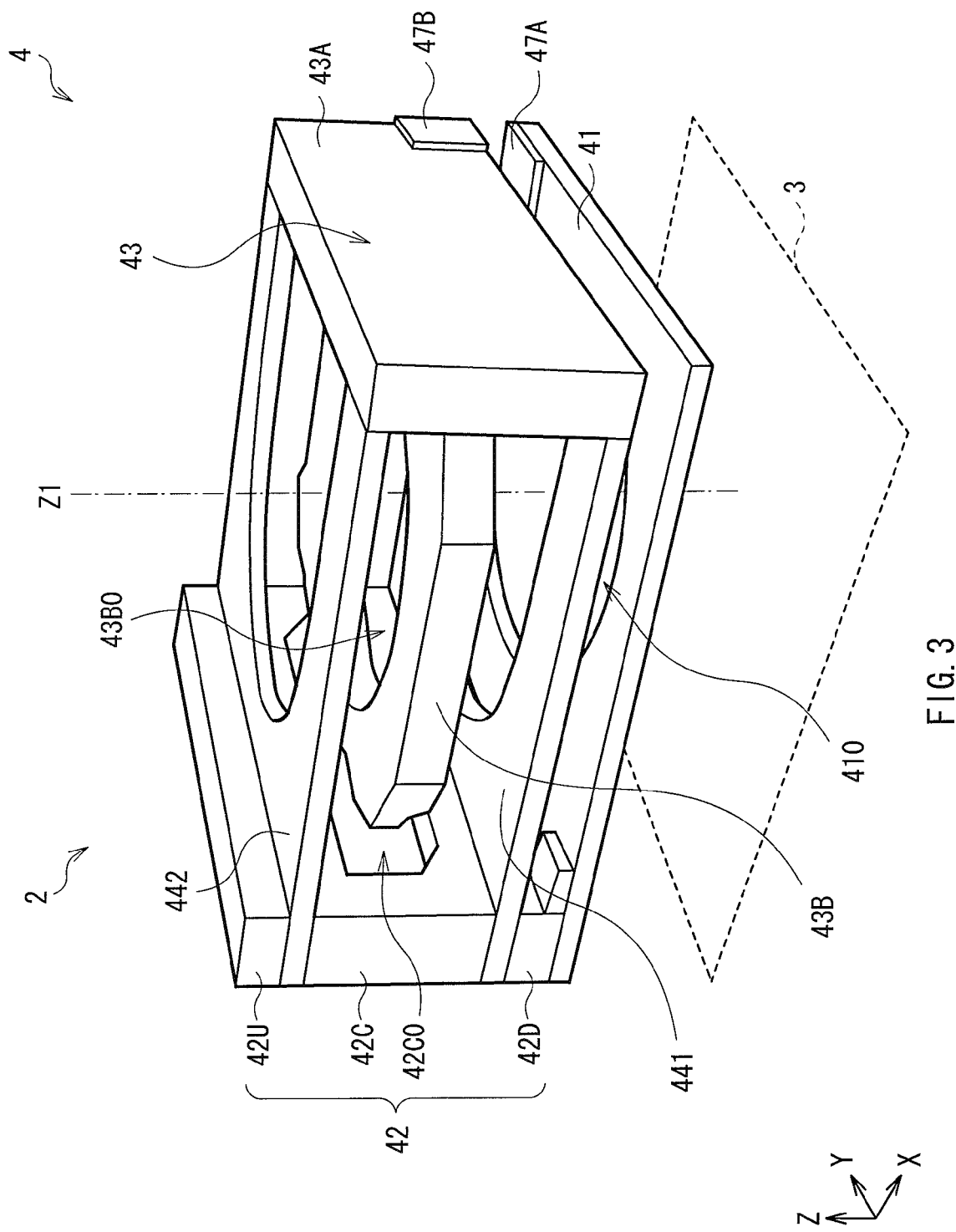
FIG. 3 is a perspective diagram illustrating a configurational example of a main part of an image pickup device depicted in FIG. 2.
Figure 4:
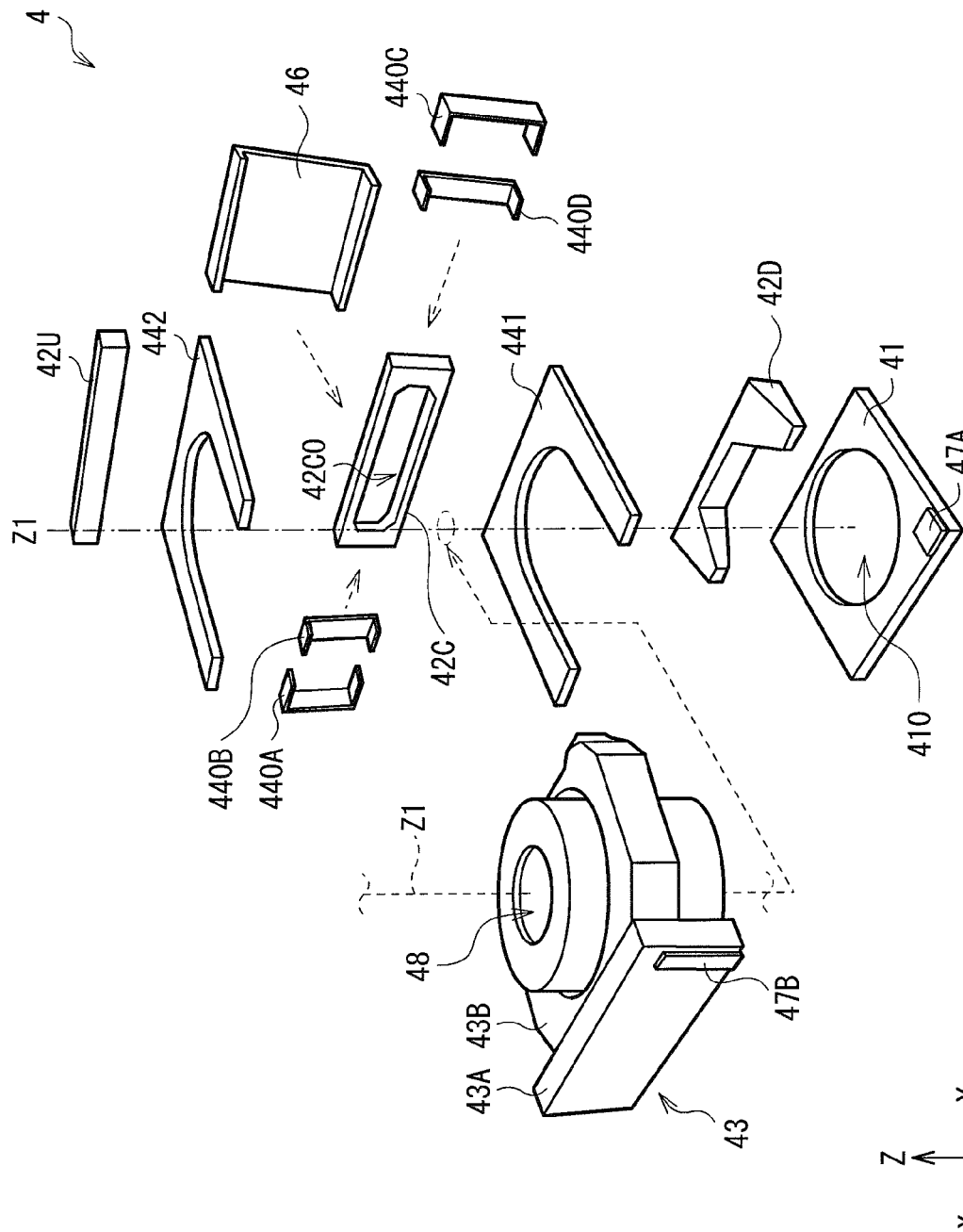
FIG. 4 is an exploded perspective view illustrating a lens module depicted in FIG. 3.
Figure 5:
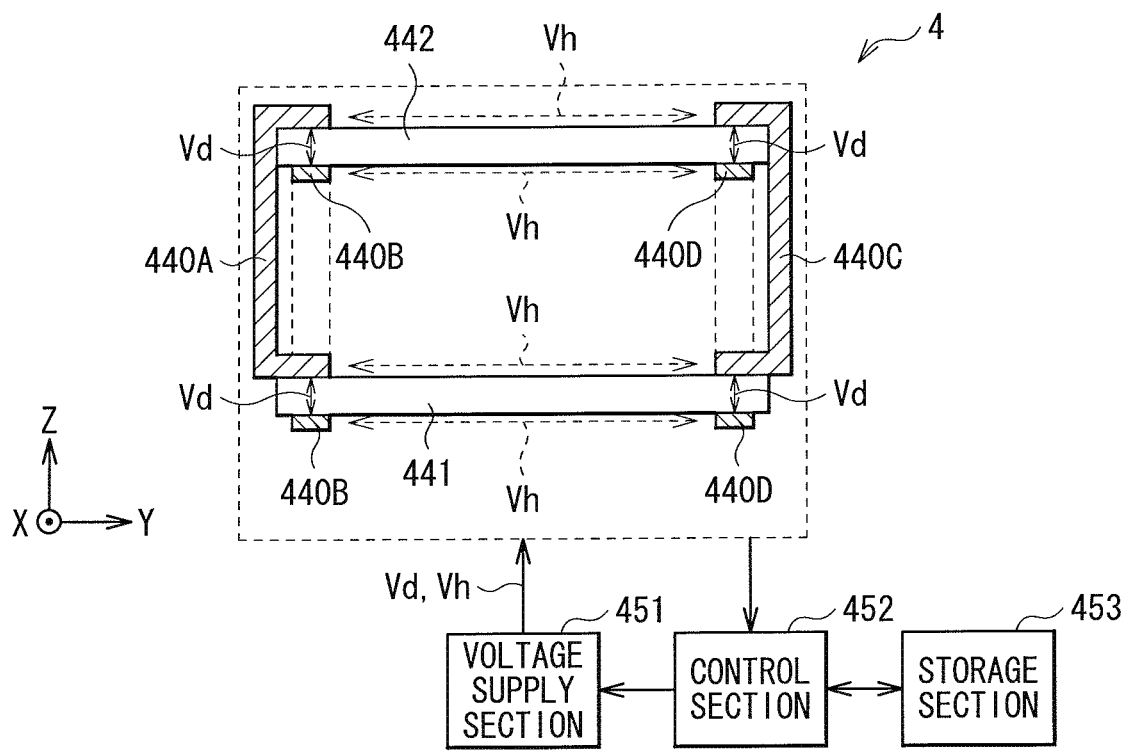
FIG. 5 is a schematic diagram illustrating a detailed arrangement configurational example of each fixed electrode illustrated in FIG. 4, together with each control block.

FIG. 3 is a perspective diagram illustrating a configuration of a main part of the image pickup device 2, and FIG. 4 is an exploded perspective diagram illustrating a configuration of the lens module 4 in this image pickup device 2. Further, FIG. 5 is a schematic diagram illustrating a detailed arrangement configurational example of each of fixed electrodes (fixed electrodes 440A, 440B, 440C, and 440D to be described later) in this lens module 4, together with each control block.

As illustrated in FIG. 3 and FIG. 4, the lens module 4 includes a support member 41, a polymer actuator element 441, a lens holding member 43, the lens 48, and a polymer actuator element 442, sequentially from the image side (the image pickup element 3 side) to the object side along an optical axis Z1 (in the normal direction of a Z-axis). It is to be noted that in FIG. 3, illustration of the lens 48 is omitted. The lens module 4 further includes, as illustrated in FIG. 4, a fixing member 42, the fixed electrodes 440A, 440B, 440C, and 440D, a presser member 46, and Hall elements 47A and 47B. This lens module 4 further includes, as illustrated in FIG. 5, a voltage supply section 451, a control section 452, and a storage section 453. It is to be noted that a combination of these members of the lens module 4 excluding the lens 48 corresponds to a specific example of "the driving unit" (lens driving unit) according to the embodiment of the present disclosure.

The support member 41 is a base member (base substrate) to support the entire lens module 4, and is made of, for example, a hard resin material such as a liquid crystal polymer.

The fixing member 42 is a member to fix one end of each of the polymer actuator elements 441 and 442, and is made of, for example, a hard resin material such as a liquid crystal polymer. This fixing member 42 includes three members; a lower fixing member 42D, a central (middle) fixing member 42C, and an upper fixing member 42U, which are arranged from the image side (a lower part in FIG. 3 and FIG. 4) to the object side (an upper part). One end of the polymer actuator element 441 and one end of each of the fixed electrodes 440A, 440B, 440C, and 440D are disposed to be interposed between the lower fixing member 42D and the central fixing member 42C. On the other hand, one end of the polymer actuator element 442 and the other end of each of the fixed electrodes 440A, 440B, 440C, and 440D are disposed to be interposed between the central fixing member 42C and the upper fixing member 42U. In addition, an opening 42C0 to partially hold a part of the lens holding member 43 (a part of a holding section 43B to be described later) is formed in the central fixing member 42C. This allows the part of the lens holding member 43 to move in this opening 42C0, making it possible to utilize space effectively, thereby downsizing the lens module 4.

The lens holding member 43 is a member to hold the lens 48, and is made of, for example, a hard resin material such as a liquid crystal polymer. The lens holding member 43 is disposed so that a center thereof is on the optical axis Z1. This lens holding member 43 includes the holding section 43B shaped like a ring and holing the lens 48, and a connection section 43A supporting the holding section 43B and connecting (linking) the holding section 43B and the other end of each of the polymer actuator elements 441 and 442 to each other, at an end. Specifically, here, four corners of the connection section 43A and two pairs of projections in the polymer actuator elements 441 and 442 are connected. In addition, the holding section 43B is disposed between driving surfaces to be described later in the pair of polymer actuator elements 441 and 442.

Each of the Hall elements 47A and 47B is an element used to detect a movement (displacement) of the lens holding member 43, and is, for example, a combination of a Hall element and a magnet.

Each of the fixed electrodes 440A, 440B, 440C, and 440D is an electrode to supply a voltage from a voltage applier (the voltage supply section 451 to be described later) to electrode films (electrode films 52A and 52B) in the polymer actuator elements 441 and 442 to be described later. Each of the fixed electrodes 440A, 440B, 440C, and 440D is made of, for example, gold (Au), gilt metal, or the like, and here, is shaped like a letter U as illustrated in FIG. 4 and FIG. 5. Further, each of the fixed electrodes 440A, 440B, 440C, and 440D holds a top and a bottom (surfaces on both sides along the Z-axis direction) of the central fixing member 42C. This makes it possible to apply the same voltages in parallel with a small number of wirings to the pair of polymer actuator elements 441 and 442. Furthermore, in a case where the fixed electrodes 440A, 440B, 440C, and 440D are made of a gilt metallic material, it is possible to prevent deterioration of contact resistance caused by surface oxidation or the like.

Here, as illustrated in FIG. 5, the fixed electrode 440A is disposed on one end side (the left side in the figure) along a Y-axis direction in the polymer actuator elements 441 and 442, to contact a top surface of each of them. The fixed electrode 440C is disposed on the other end side (the right side in the figure) along the Y-axis direction in the polymer actuator elements 441 and 442, to contact the top surface of each of them. Meanwhile, the fixed electrode 440B is disposed on the one end side along the Y-axis direction in the polymer actuator elements 441 and 442, to contact an undersurface of each of them. The fixed electrode 440D is disposed on the other end side along the Y-axis direction in the polymer actuator elements 441 and 442, to contact the undersurface of each of them. As illustrated in the figure, driving voltages Vd for driving (operating) the polymer actuator elements 441 and 442 are supplied from the voltage supply section 451, which will be described below, each of between the fixed electrodes 440A and 440B and between the fixed electrodes 440C and 440D. On the other hand, heating voltages Vh for heating (causing generation of heat) the polymer actuator elements 441 and 442 are supplied from the voltage supply section 451, each of between the fixed electrodes 440A and 440C and between the fixed electrodes 440B and 440D. Here, it is desirable that each of a distance between the fixed electrodes 440A and 440C and a distance between the fixed electrodes 440B and 440D to which the heating voltages Vh are applied, be sufficiently longer than the thickness (the length in the Z-axis direction) of each of the polymer actuator elements 441 and 442. This is to prevent an electric field (an oblique field) from being generated along a slanting direction in a cross section of each of the polymer actuator elements 441 and 442. It is to be noted that a technique of heating the polymer actuator elements 441 and 442 using this heating voltage Vh will be described later in detail.

The voltage supply section 451 illustrated in FIG. 5 supplies, as described above, the driving voltage Vd and the heating voltage Vh to the polymer actuator elements 441 and 442, via the fixed electrodes 440A, 440B, 440C, and 440D. Specifically, in the present embodiment in particular, as illustrated in the figure, the voltage supply section 451 supplies the driving voltage Vd along a thickness direction of each of the polymer actuator elements 441 and 442 (between the pair of electrode films 52A and 52B to be described later). On the other hand, the voltage supply section 451 supplies the heating voltage Vh along an extending direction of each of the polymer actuator elements 441 and 442 (an intra-film direction of each of the electrode films 52A and 52B to be described later). A technique of supplying the driving voltage Vd and the heating voltage Vh will be described later in detail.

Although details will be described later, the control section 452 determines whether or not to supply the heating voltage Vh, as well as the magnitude, waveform, and the like of the heating voltage Vh at the time of supplying, based on an environmental temperature (an environmental temperature T) detected directly or indirectly. Such a control section 452 is configured by using, for example, a microcomputer or the like. Control operation of this control section 452 will be described later in detail.

The storage section 453 is a memory holding beforehand data (such as characteristic data indicating a relationship between the environmental temperature T and a driving current I or a working speed v, which will be described later) used at the time of the control operation by the control section 452 described above. As such a storage section 453, various types of storage sections may be used.

(Polymer Actuator Elements 441 and 442)

The polymer actuator elements 441 and 442 each have a driving surface orthogonal to the optical axis Z1 of the lens 48 (a driving surface on an X-Y plane), and are disposed so that the driving surfaces face each other along this optical axis Z1. Each of the polymer actuator elements 441 and 442 is intended to drive the lens holding member 43 (and the lens 48) along the optical axis Z1.

Figure 6:
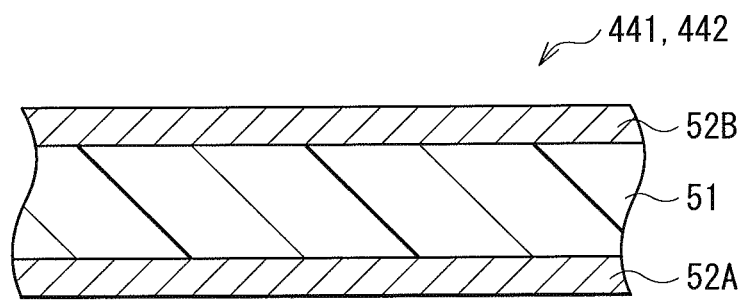
FIG. 6 is a cross-sectional diagram illustrating a detailed configurational example of a polymer actuator element.

Each of these polymer actuator elements 441 and 442 has, as illustrated in FIG. 6, a sectional structure in which the pair of electrode films 52A and 52B adhere to both sides of an ionic conductive polymer compound film 51 (hereinafter merely referred to as the polymer compound film 51). In other words, each of the polymer actuator elements 441 and 442 has the pair of electrode films 52A and 52B, and the polymer compound film 51 inserted between these electrode films 52A and 52B. The polymer actuator elements 441 and 442 and the electrode films 52A and 52B may be covered by an insulating protective film made of a material having high elasticity (for example, polyurethane) in the periphery thereof.

Figure 7:
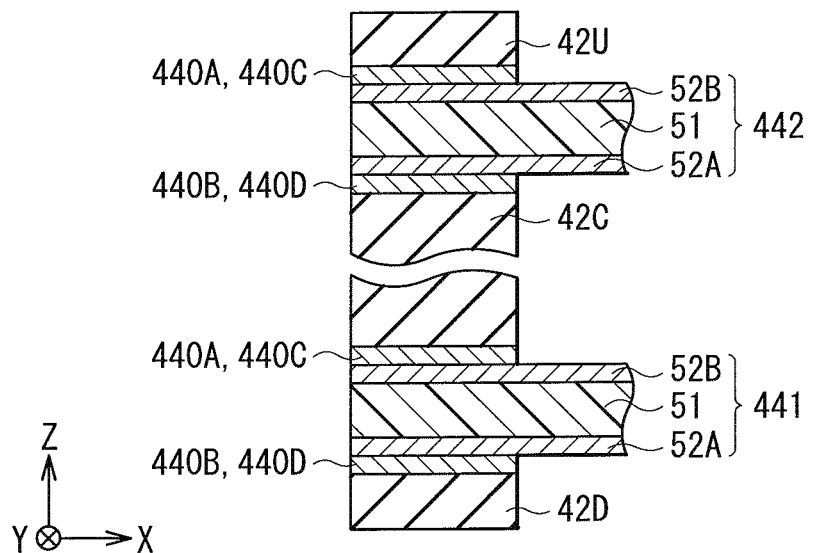
FIG. 7 is a cross-sectional diagram illustrating a detailed configuration of part of the polymer actuator element, a fixing member, and the fixed electrode.

Here, as indicated by a cross section (a Z-X cross section) in FIG. 7, in the polymer actuator element 441, the electrode film 52A is electrically connected to the fixed electrodes 440B and 440D on the lower fixing member 42D side, and the electrode film 52B is electrically connected to the fixed electrodes 440A and 440C on the central fixing member 42C side. On the other hand, in the polymer actuator element 442, the electrode film 52A is electrically connected to the fixed electrodes 440B and 440D on the central fixing member 42C side, and the electrode film 52B is electrically connected to the fixed electrodes 440A and 440C on the upper fixing member 42U side. Although not illustrated in FIG. 7, each member and electrode, from the fixed electrodes 440B and 440D on the lower fixing member 42D side to the fixed electrodes 440A and 440C on the upper fixing member 42U side, is fixed as being clamped by the presser member 46 (flat spring) illustrated in FIG. 4 with constant pressure. This prevents the polymer actuator elements 441 and 442 from being destroyed even when a large force is exerted thereon, and allows stable electrical connection even when these polymer actuator elements 441 and 442 are deformed.

The polymer compound film 51 is configured to be curved by a predetermined potential difference occurring between the electrode films 52A and 52B. This polymer compound film 51 is impregnated with an ionic substance. The "ionic substance" here means a substance including cations and/or anions and a polar solvent, or a substance including liquid cations and/or anions. For example, as the former, there is a substance in which a polar solvent is solvated in cations and/or anions, and as the latter, there is an ionic liquid.

As a material of the polymer compound film 51, there is, for example, an ion exchange resin in which a fluorocarbon resin or a hydrocarbon system is a skeleton. As the ion exchange resin, it is preferable to use a cation exchange resin when a cationic substance is impregnated, and use an anion exchange resin when an anionic substance is impregnated.

As the cation exchange resin, there is, for example, a resin into which an acidic group such as a sulfonate group or a carboxyl group is introduced. Specifically, the cation exchange resin is a polyethylene having an acidic group, a polystyrene having an acidic group, a fluorocarbon resin having an acid group, or the like. Above all, a fluorocarbon resin having a sulfonate group or a carboxylic acid group is preferable as the cation exchange resin, and there is, for example, Nafion (made by E. I. du Pont de Nemours and Company).

It is desirable that the cationic substance impregnated in the polymer compound film 51 be a substance including metal ions and water, a substance including organic cations and water, or an ionic liquid. As the metal ion, there is, for example, light metal ion such as sodium ion ($Na^+$), potassium ion ($K^+$), lithium ion ($Li^+$), or magnesium ion ($Mg^{2+}$). Further, as the organic cation, there is, for example, alkylammonium ion. These cations exist as a hydrate in the polymer compound film 51. Therefore, in a case where the polymer compound film 51 is impregnated with the cationic substance including cations and water, it is desirable to seal the whole in order to suppress volatilization of the water, in the polymer actuator elements 441 and 442.

The ionic liquid is also called ambient temperature molten salt, and includes cations and anions having low combustion and volatility. As the ionic liquid, there is, for example, an imidazolium ring system compound, a pyridinium ring system compound, or an aliphatic compound.

Above all, it is preferable that the cationic substance be the ionic liquid. This is because the volatility is low, and the polymer actuator elements 441 and 442 work well even in a high-temperature atmosphere or in a vacuum.

Each of the electrode films 52A and 52B facing each other across the polymer compound film 51 interposed therebetween includes one or more than one kind of conductive material. It is preferable that each of the electrode films 52A and 52B be a film in which particles of a conductive material powder are bound by an ionic conductive polymer. This is because flexibility of the electrode films 52A and 52B increases. A carbon powder is preferable as the conductive material powder. This is because the conductivity is high, and the specific surface area is large and thus, a larger deformation is achieved. As the carbon powder, Ketjen black is preferable. As the ionic conductive polymer, the same material as that of the polymer compound film 51 is desirable.

The electrode films 52A and 52B are formed as follows, for example. A coating in which a conductive material powder and a conductive polymer are dispersed in a dispersion medium is applied to each of both sides of the polymer compound film 51, and then dried. A film-shaped substance including a conductive material powder and an ionic conductive polymer may be pressure-bonded to each of both sides of the polymer compound film 51.

The electrode films 52A and 52B may each have a multilayer structure, and in that case, it is desirable that each of the electrode films 52A and 52B have such a structure that a layer in which particles of a conductive material powder are bound by an ionic conductive polymer and a metal layer are laminated sequentially from the polymer compound film 51 side. This is because an electric potential becomes closer to a further uniform value in an in-plane direction of the electrode films 52A and 52B, and superior deformability is obtained. As a material of the metal layer, there is a noble metal such as gold or platinum. The thickness of the metal layer is arbitrary, but is preferably a continuous film so that the electric potential becomes uniform in the electrode films 52A and 52B. As a method of forming the metal layer, there is plating, deposition, sputtering, or the like.

The size (width and length) of the polymer compound film 51 may be, for example, freely set according to the size and weight of the lens holding member 43, or a desirable displacement of the polymer compound film 51. The displacement of the polymer compound film 51 is set according to a desired movement along the optical axis Z1 of the lens holding member 43.

(Operation and Effect of Image Pickup Device 2)

Subsequently, the operation and effect of the image pickup device 2 of the present embodiment will be described.

(1. Operation of Polymer Actuator Elements 441 and 442)

Figure 8A:
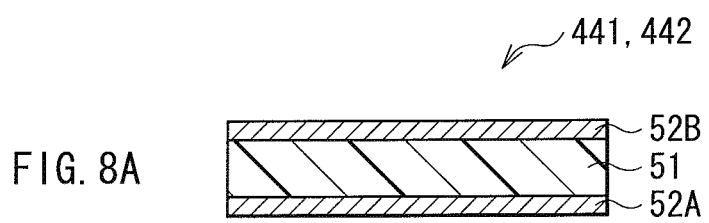
FIGS. 8A and 8B are cross-sectional schematic diagrams for explaining basic operation of the polymer actuator element.
Figure 8B:
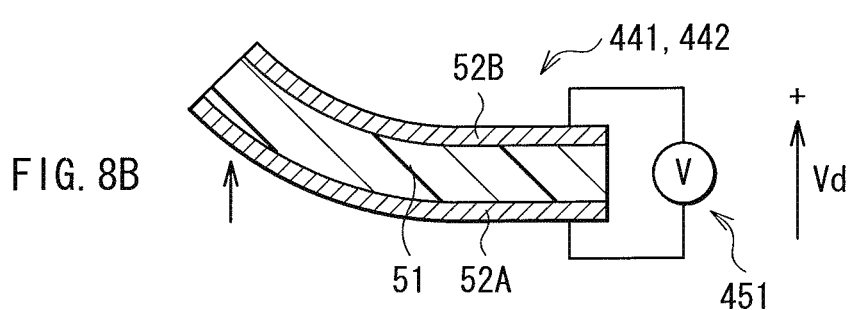

First, the operation of the polymer actuator elements 441 and 442 will be described with reference to FIGS. 8A and 8B. FIGS. 8A and 8B each schematically illustrate the operation of the polymer actuator elements 441 and 442, using a cross-sectional diagram.

At first, a case where a substance including cations and a polar solvent is used as the cationic substance will be described.

In this case, the cationic substance disperses approximately uniformly in the polymer compound film 51 and thus, the polymer actuator elements 441 and 442 in a state of no voltage application become flat without curving (FIG. 8A). Here, when a voltage applied state is established using the voltage supply section 451 (application of the driving voltage Vd begins), the polymer actuator elements 441 and 442 exhibit the following behavior. When, for example, the predetermined driving voltage Vd is applied between the electrode films 52A and 52B so that the electrode film 52A is at a negative potential whereas the electrode film 52B is at a positive potential, the cations in a state of being solvated in the polar solvent move to the electrode film 52A side. At this time, the anions hardly move in the polymer compound film 51 and thus, in the polymer compound film 51, the electrode film 52A side swells, while the electrode film 52B side shrinks. As a result, the polymer actuator elements 441 and 442 curve toward the electrode film 52B side as a whole, as illustrated in FIG. 8B. Subsequently, when the state of no voltage application is established by eliminating the potential difference between the electrode films 52A and 52B (the application of the driving voltage Vd is stopped), the cationic substance (the cations and polar solvent) localized to the electrode film 52A side in the polymer compound film 51 diffuses, and return to the state illustrated in FIG. 8A. Further, when the predetermined driving voltage Vd is applied between the electrode films 52A and 52B so that the electrode film 52A shifts to a positive potential and the electrode film 52B shifts to a negative potential, from the state of no voltage application illustrated in FIG. 8A, the cations in the state of being solvated in the polar solvent move to the electrode film 52B side. In this case, in the polymer compound film 51, the electrode film 52A side shrinks while the electrode film 52B side swells and thus, as a whole, the polymer actuator elements 441 and 442 curve toward the electrode film 52A side.

Next, a case where an ionic liquid containing liquid cations is used as the cationic substance will be described.

In this case as well, similarly, in the state of no voltage application, the ionic liquid is dispersed in the polymer compound film 51 approximately uniformly and thus, the polymer actuator elements 441 and 442 become flat as illustrated in FIG. 8A. Here, when a voltage applied state is established by using the voltage supply section 451 (application of the driving voltage Vd begins), the polymer actuator elements 441 and 442 exhibit the following behavior. When, for example, the predetermined driving voltage Vd is applied between the electrode films 52A and 52B so that the electrode film 52B is at a positive potential, whereas the electrode film 52A is at a negative potential, the cations of the ionic liquid move to the electrode film 52A side, and the anions hardly move in the polymer compound film 51 which is a cation-exchanger membrane. For this reason, in the polymer compound film 51, the electrode film 52A side swells, while the electrode film 52B side shrinks. As a result, the polymer actuator elements 441 and 442 curve toward the electrode film 52B side as a whole, as illustrated in FIG. 8B. Subsequently, when the state of no voltage application is established by eliminating the potential difference between the electrode films 52A and 52B (the application of the driving voltage Vd is stopped), the cations localized to the electrode film 52A side in the polymer compound film 51 diffuse, and return to the state illustrated in FIG. 8A. Further, when the predetermined driving voltage Vd is applied between the electrode films 52A and 52B so that the electrode film 52A shifts to a positive potential and the electrode film 52B shifts to a negative potential from the state of no voltage application illustrated in FIG. 8A, the cations of the ionic liquid move to the electrode film 52B side. In this case, in the polymer compound film 51, the electrode film 52A side shrinks, whereas the electrode film 52B side swells and thus, as a whole, the polymer actuator elements 441 and 442 curve toward the electrode film 52A side.

(2. Operation of Image Pickup Device 2)

Subsequently, the operation of the entire image pickup device 2 will be described with reference to FIGS. 9A and 9B. FIGS. 9A and 9B each illustrate the operation of the lens module 4 in the image pickup device 2 in a perspective diagram. FIG. 9A illustrates a state before the operation, and FIG. 9B illustrates a state after the operation.

In the lens module 4 in the image pickup device 2, as illustrated in FIG. 3 and FIG. 4 described above as well as FIGS. 9A and 9B, the lens 48 becomes movable along the optical axis Z1, by driving the lens holding member 43 through use of the pair of polymer actuator elements 441 and 442. In this way, in the lens module 4, the lens 48 is driven along the optical axis Z1 by the driving unit (lens driving unit) employing the polymer actuator elements 441 and 442.

(3. Technique of Heating Polymer Actuator Elements 441 and 442)

Subsequently, the technique (heating control) of heating the polymer actuator elements 441 and 442 by the voltage supply section 451, the control section 452, and the storage section 453, which is one of characteristic parts of the present technology, will be described in detail.

Figure 10:
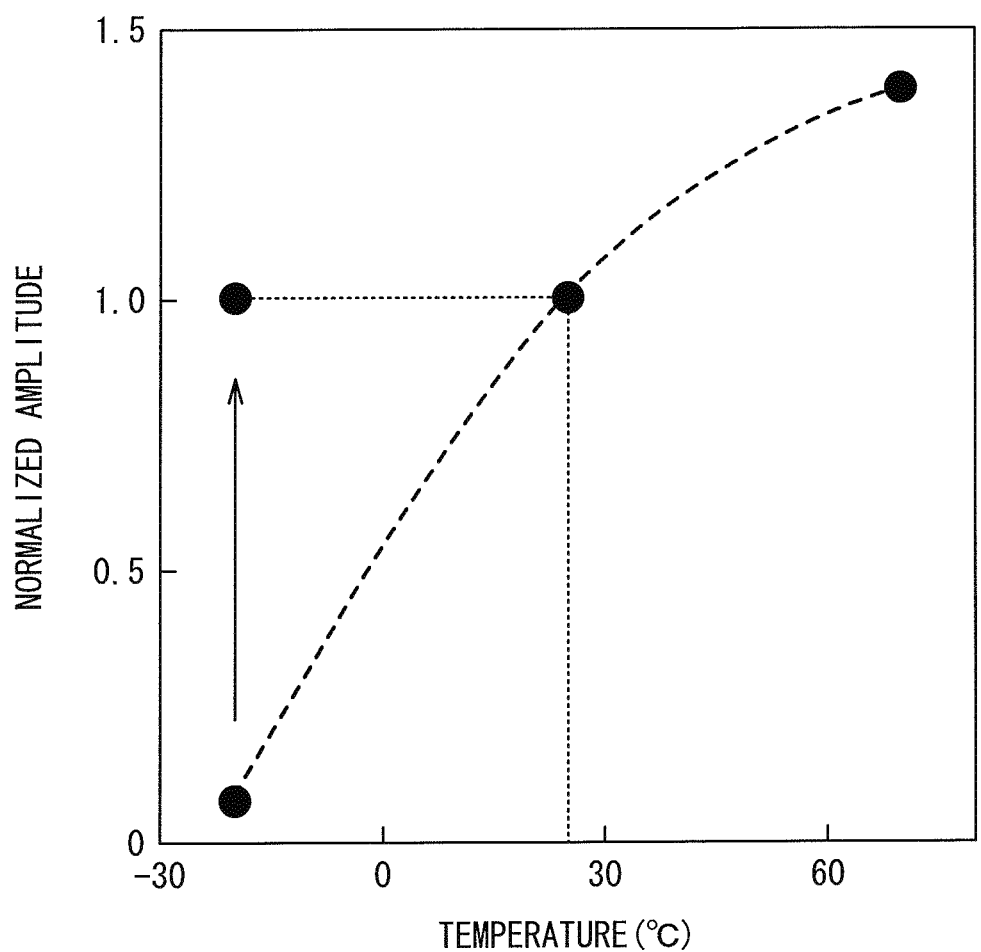
FIG. 10 is a characteristic diagram illustrating an example of a temperature characteristic of the polymer actuator element.

First, in the polymer actuator elements 441 and 442, as illustrated in FIG. 10, for example, the characteristic of the element declines (deteriorates) in a low temperature environment (here, for example, around −30° C.), compared to a room temperature environment (here, for example, around 25° C.). Specifically, the displacement of the polymer actuator elements 441 and 442 illustrated in the figure (illustrated here as a normalized amplitude) declines, and the working speed decreases. This results from the fact that in the polymer actuator elements 441 and 442, ion mobility in the polymer compound film 51 (ion exchange resin film) described above decreases in the low temperature environment, compared to the room temperature environment.

Thus, it is conceivable to provide a heat source (heater) outside the element in order to improve the characteristic of such polymer actuator elements 441 and 442 in the low temperature environment. However, provision of such a dedicated heat source separately makes a device configuration large (complicated).

Therefore, in the present embodiment, as will be described below in detail, the voltage supply section 451 supplies the polymer actuator elements 441 and 442 with the heating voltage Vh in addition to the driving voltage Vd, via the fixed electrodes 440A, 440B, 440C, and 440D. This allows the temperature of the element to rise through heat generated by the polymer actuator elements 441 and 442 themselves (by using the elements themselves as a heat source), without providing the above-mentioned dedicated heat source outside the element separately. As a result, as will be described later, it is possible to improve the characteristics (the displacement or the working speed) of the polymer actuator elements 441 and 442 in the low temperature environment (see, for example, an arrow in FIG. 10). In other words, the characteristics equal or superior to those in the room temperature environment may be obtained even in the low temperature environment.

Figure 11A:
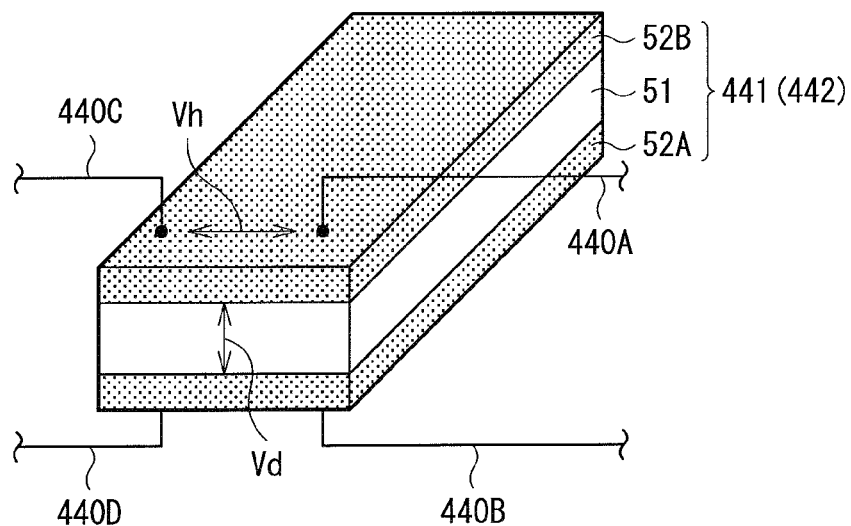
FIGS. 11A and 11B are schematic perspective diagrams for explaining a technique of applying a driving voltage and a heating voltage according to the embodiment.
Figure 11B:
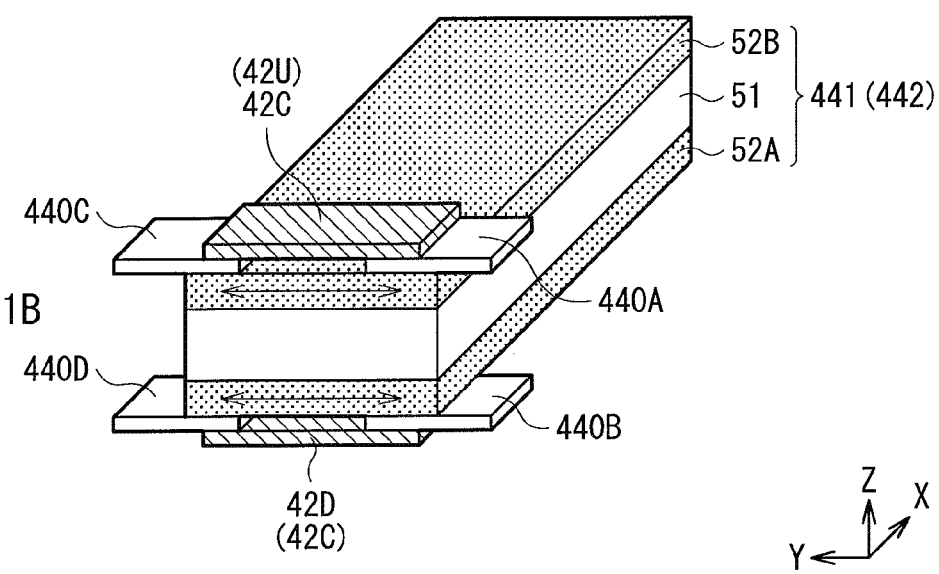

Specifically, as schematically illustrated in FIGS. 11A and 11B, for example, the voltage supply section 451 of the present embodiment supplies the driving voltage Vd (here, along a Z-axis direction) between the pair of electrode films 52A and 52B in each of the polymer actuator elements 441 and 442. Specifically, the voltage supply section 451 supplies the driving voltage Vd to each of between the fixed electrodes 440A and 440B and between the fixed electrodes 440C and 440D. On the other hand, the voltage supply section 451 of the present embodiment supplies the heating voltage Vh (here, along the Y-axis direction) in the intra-film direction of each of the electrode films 52A and 52B in each of the polymer actuator elements 441 and 442. Specifically, the voltage supply section 451 supplies the heating voltage Vh to each of between the fixed electrodes 440A and 440C and between the fixed electrodes 440B and 440D. To be more specific, in the present embodiment, as indicated by an allow in the figure, the voltage supply section 451 selectively supplies the heating voltage Vh to a region (a region on a root side) of the fixing member 42 side (a fixed side) in the polymer actuator elements 441 and 442. In other words, the voltage supply section 451 supplies the heating voltage Vh along a width direction (here, a Y-axis direction) in the region on the root side of the polymer actuator elements 441 and 442. This makes it possible to simplify a wiring structure to supply the heating voltage Vh, as compared to a technique in a modification 2 (an example of a technique of supplying the heating voltage Vh from a fixed side along a movable side) that will be described later. In addition, the root region where the displacement is relatively large in each of the polymer actuator elements 441 and 442 is selectively heated and thus, it is possible to heat the element efficiently, as compared to the technique of the modification 2.

Figure 12:
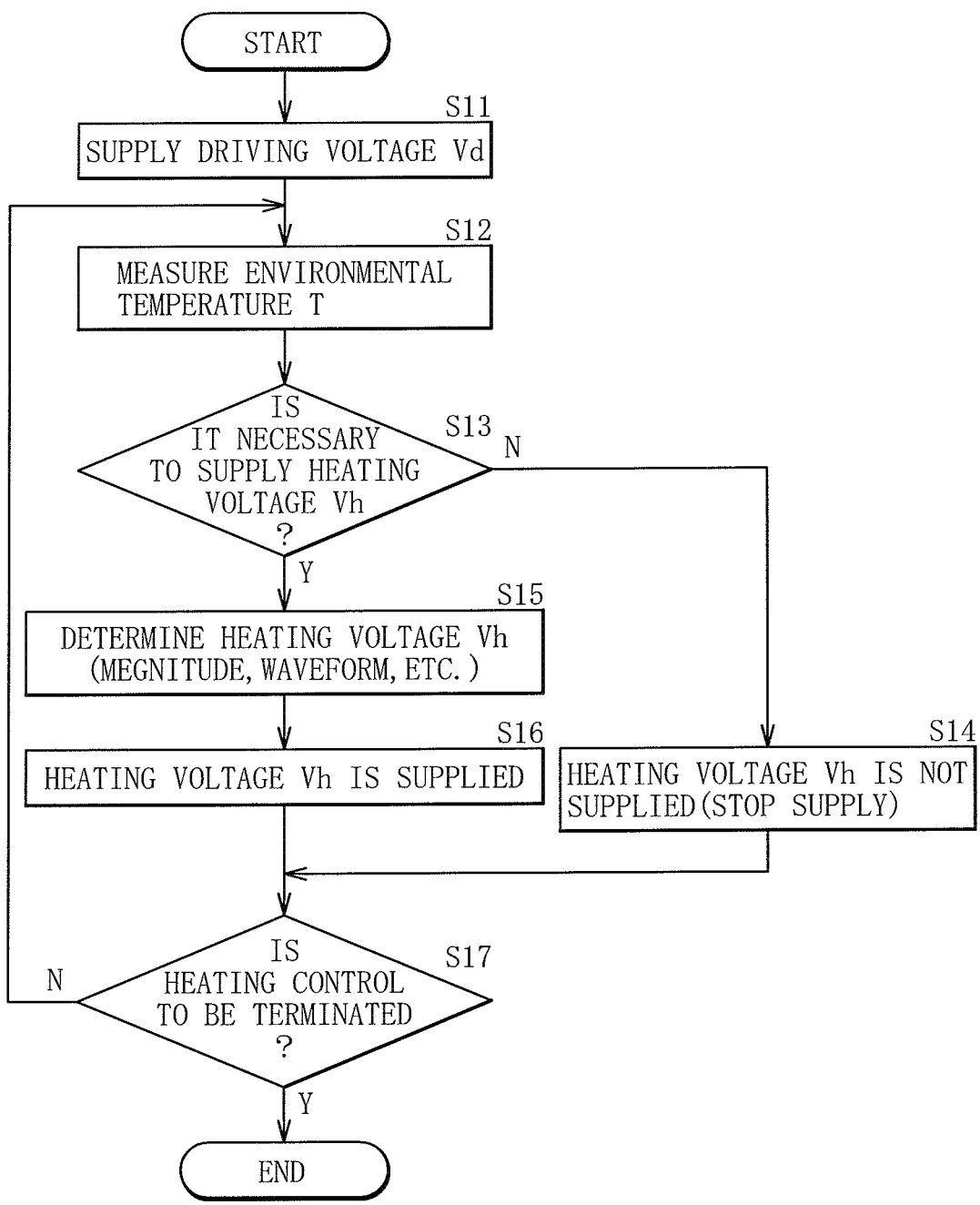
FIG. 12 is a flowchart illustrating an example of a technique of heating the polymer actuator element according to the embodiment.

FIG. 12 is a flowchart illustrating an example of the technique of heating the polymer actuator elements 441 and 442 according to the present embodiment.

In this technique, at first, as a premise, the voltage supply section 451 supplies the driving voltage Vd to the polymer actuator elements 441 and 442, thereby causing these polymer actuator elements 441 and 442 to operate (transform) (step S11).

Figure 13:
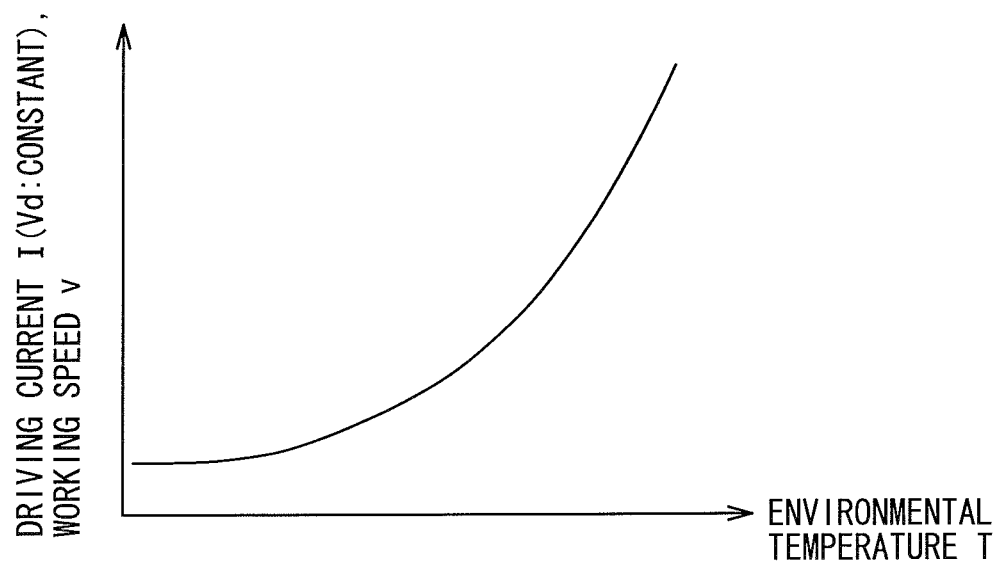
FIG. 13 is a characteristic diagram illustrating an example of a relationship between an environmental temperature and a driving current or a working speed in the polymer actuator element.

Subsequently, an environmental temperature T around the polymer actuator elements 441 and 442 is measured (detected) directly or indirectly by a measuring section (a detecting section) not illustrated (step S12). Specifically, the environmental temperature T is detected directly by, for example, an external temperature sensor or the like such as a thermocouple. Alternatively, the environmental temperature T is detected indirectly based on a measured driving current I or a working speed v, by using characteristic data indicating the relationship between the measured driving current I flowing in the element (when the driving voltage Vd is constant) and the environmental temperature T, characteristic data indicating the relationship between the working speed v of the element and the environmental temperature T, or the like (for example, see FIG. 13). At this time, the measurement of the driving current I may be performed using, for example, an ammeter not illustrated, and the measurement of the working speed v may be performed using, for example, a result of measurement in the Hall elements 47A and 47B. In addition, the characteristic data indicating the relationship between the environmental temperature T and the driving current I or the working speed v described above may be held beforehand in, for example, the storage section 453.

Subsequently, based on the environmental temperature T detected directly or indirectly in this way, the control section 452 first determines (decides) whether or not to supply (whether it is necessary to supply) the heating voltage Vh (step S13). Specifically, for example, when the detected environmental temperature T is lower than a predetermined threshold temperature Tth (the environment is the low temperature environment), the control section 452 determines that it is necessary to supply the heating voltage Vh. On the other hand, when the detected environmental temperature T is higher than the threshold temperature Tth mentioned above (the environment is not the low temperature environment), the control section 452 determines that it is not necessary to supply the heating voltage Vh. When the control section 452 determines (decides) that it is not necessary to supply the heating voltage Vh (step S13: N), the voltage supply section 451 does not supply the heating voltage Vh (or stops supplying, or lowers the value of the heating voltage Vh) (step S14). After that, the flow proceeds to step S17 to be described later.

On the other hand, when the control section 452 determines (decides) that it is necessary to supply the heating voltage Vh (step S13: Y), the control section 452 subsequently determines (decides) the magnitude, waveform, and the like of the heating voltage Vh to be supplied, based on the above-described environmental temperature T (step S15). Specifically, the control section 452 determines the magnitude (voltage value) of the heating voltage Vh, whether the heating voltage Vh is a direct current (DC) voltage or an alternating current (AC) voltage, the frequency in the case of the AC voltage, and the like. When the same heating voltages Vh are supplied, the lower the resistance values of the fixed electrodes 440A, 440B, 440C, and 440D are, the greater the heating value in the polymer actuator elements 441 and 442 is. This is based on a relational expression; Joule heat Q=(driving voltage Vd²/resistance value R of fixed electrode).

Here, in the arrangement configuration of the fixed electrodes 440A, 440B, 440C, and 440D illustrated in FIG. 5 described above, a situation schematically illustrated, for example, in FIG. 14A will be considered. In this situation, as the combination of voltages to be supplied under a condition that driving voltages Vd1 and Vd2 at both ends of each of the polymer actuator elements 441 and 442 along the Y-axis direction are supplied to become equal to each other, there are two combinations illustrated in FIGS. 14B and 14C as described below. It is to be noted that in the figures, each of Vd, Vd1, and Vd2 represents an arbitrary DC or AC driving voltage (≠0 volt), each of Vh, Vh1 and Vh2 represents an arbitrary DC or AC heating voltage (≠0 volt), and the direction of each arrow indicates the direction of a voltage drop (a positive potential difference).

First, in the situation illustrated in FIG. 14A, when the driving voltages Vd1 and Vd2 are equal to each other (Vd1=Vd2) as mentioned above (when localization of ions in the polymer compound film 51 is prevented from taking place), the following expression (1) is satisfied based on Kirchhoff's law. Here, when the condition of Vd1=Vd2 mentioned above is substituted into this expression (1), Vh1=Vh2 is satisfied. Therefore, there are two combinations of voltages: when Vh1=Vh2>0 (corresponding to FIG. 14B) and when Vh1=Vh2<0 (corresponding to FIG. 14C). The driving voltage Vd and the heating voltage Vh at this time are arbitrary voltages independent of each other (the respective voltage values and phases may be different). In addition, it is possible to determine the driving voltage Vd and the heating voltage Vh independently, by adjusting the voltages to be supplied to the fixed electrodes 440A, 440B, 440C, and 440D.

$$Vd1=Vh1+Vd2-Vh2 \quad (1)$$

Figure 15A:
FIGS. 15A and 15B are timing charts each illustrating a waveform example of the heating voltage according to the embodiment.
Figure 15B:
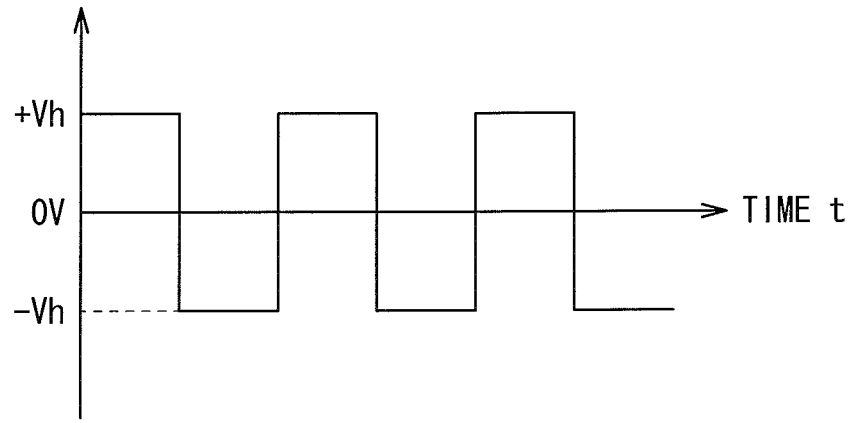

Further, as the heating voltage Vh, it is possible to use, for example, a DC voltage as illustrated in FIG. 15A, or an AC voltage as illustrated in FIG. 15B, but use of the AC voltage is desirable. This is to prevent the localization of ions from occurring along the film thickness direction in the polymer compound film 51 (to prevent undesirable deformation from taking place).

Next, the voltage supply section 451 supplies the heating voltage Vh determined in this way by the control section 452 to the polymer actuator elements 441 and 442 (step S16). Subsequently, the control section 452 determines whether or not to terminate the entire heating control illustrated in FIG. 12, in accordance with, for example, a command from a user, or the like (step S17). When it is determined that the heating control is not to be terminated (is to be continued) (step S17: N), the flow returns to step S12 described above, and when it is determined that the heating control is to be terminated (step S17: Y), the entire control ends.

Figures 16A, 16B:
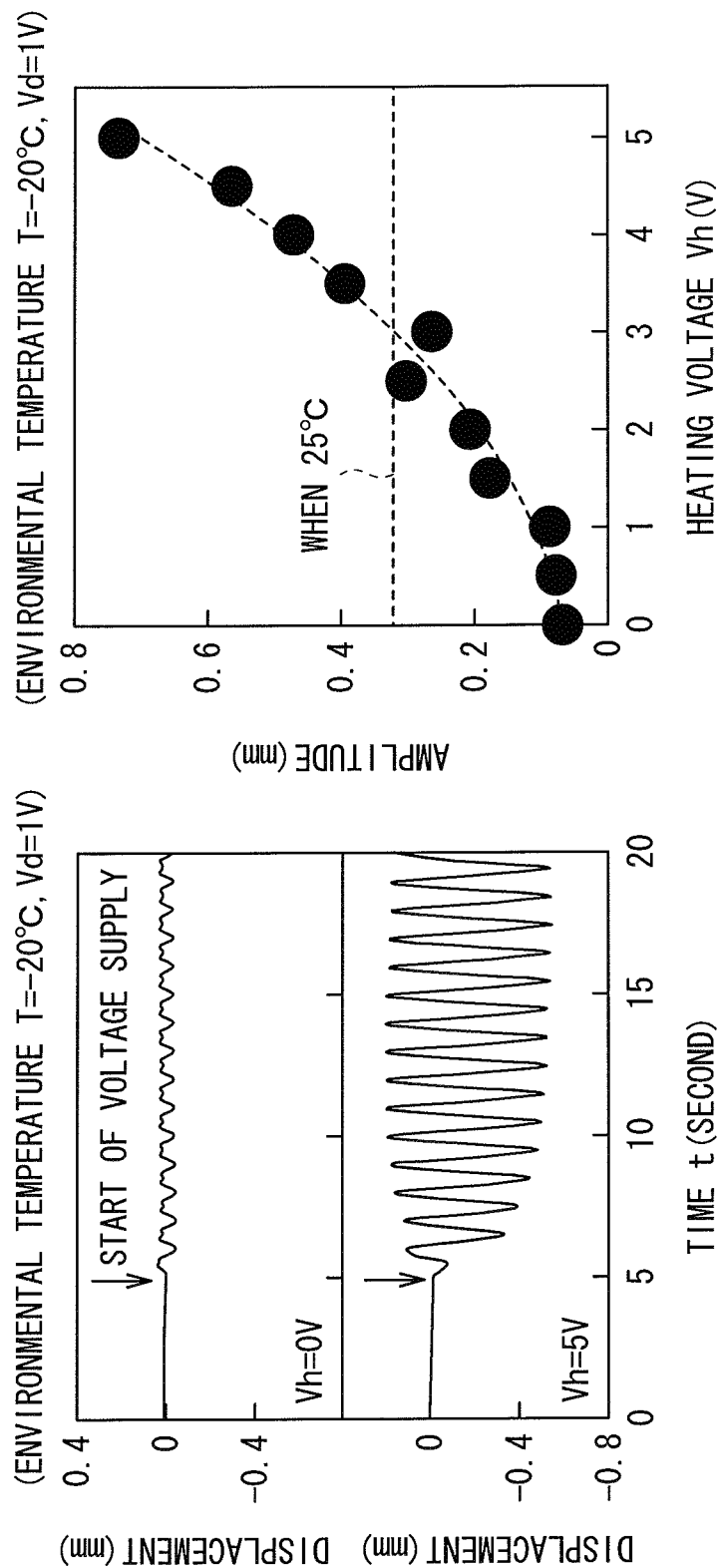
FIGS. 16A and 16B are characteristic diagrams illustrating an effect of applying a heating voltage according to an example of the embodiment.

FIGS. 16A and 16B illustrate an effect of applying the heating voltage Vh according to an example of the present embodiment. FIG. 16A illustrates a relationship between time (voltage application time) and the displacement of the polymer actuator elements 441 and 442, and FIG. 16B illustrates a relationship between the heating voltage Vh and the amplitude during the operation of the polymer actuator elements 441 and 442. It is to be noted that in this example, the environmental temperature T=−20° C., the driving voltage Vd=1 volt (±1 volt), and a frequency f of the driving voltage Vd=1 Hz. Further, arrows in FIG. 16A each indicate the timing when the supply of the driving voltage Vd is started.

First, when a case of the heating voltage Vh=0 volt and a case the heating voltage Vh=5 volts are compared to each other, it is found from FIG. 16A that supplying the heating voltage Vh=5 volts greatly increases the displacement of the polymer actuator elements 441 and 442, improving the characteristics in the low temperature environment. In addition, it is found from FIG. 16B that the amplitude of the polymer actuator elements 441 and 442 increases exponentially as the voltage value of this heating voltage Vh increases, improving the characteristics in the low temperature environment further.

In the present embodiment as described above, the driving voltage Vd and the heating voltage Vh are supplied to the polymer actuator elements 441 and 442 and thus, it is possible to increase the temperature of the elements by the heat generation of the polymer actuator elements 441 and 442 themselves, and it is possible to improve the displacement, the working speed, and the like of the elements in the low temperature environment, without providing an external dedicated heat source separately. Therefore, it is possible to improve the characteristics in the low temperature environment, while reducing the size (the weight).

In addition, the heating voltage Vh is supplied selectively to the region (the region on the root side) on the fixing member 42 side (the fixed side) in the polymer actuator elements 441 and 442 and thus, it is possible to simplify the wiring structure to supply the heating voltage Vh, compared to the technique of the modification 2 that will be described later. Moreover, the root region where the displacement is relatively large in the polymer actuator elements 441 and 442 is selectively heated and thus, it is possible to heat the elements efficiently, compared to the technique of the modification 2.

[Modifications]

Subsequently, modifications (modifications 1-3) of the embodiment will be described. It is to be noted that the same elements as those of the embodiment will be provided with the same reference characters as those of the embodiment, and description will be omitted as appropriate.

(Modification 1)

FIGS. 17A to 17C each illustrate a configurational example of polymer actuator elements 441 and 442 and fixed electrodes (here, fixed electrodes 440A and 440C are taken as examples) according to the modification 1, in a schematic diagram. In the present modification, a heating voltage Vh is supplied (from a fixed side along a movable side) to the entire surface in each of electrode films 52A and 52B of each of the polymer actuator elements 441 and 442, while the configuration of the fixed electrodes in the embodiment described above is basically used.

Specifically, in the example illustrated in FIG. 17A, the pair of fixed electrodes 440A and 440C are provided on the fixing member 42 side (fixed side) on the electrode film 52B of each of the polymer actuator elements 441 and 442. In the polymer actuator elements 441 and 442, a notch 40C (first notch section) is formed by cutting the whole elements (each film) from an end on the fixed side to the opposite side (to the normal direction of an X-axis), in a region between these fixed electrodes 440A and 440C. This makes it possible to supply the heating voltage Vh to the entire surface in each of the electrode films 52A and 52B of each of the polymer actuator elements 441 and 442 (from the fixed side along the movable side), while using the configuration of the fixed electrodes in the embodiment described above. In other words, it is possible to supply the heating voltage Vh (from the fixed side along the movable side) to the entire surface in each of the electrode films 52A and 52B, while simplifying the configuration of the fixed electrodes, compared to the technique of the modification 2 which will be described later.

In addition, in the example illustrated in FIG. 17B, similarly, the pair of fixed electrodes 440A and 440C are provided on the fixing member 42 side (fixed side) on the electrode film 52B of each of the polymer actuator elements 441 and 442. In the polymer actuator elements 441 and 442, a notch 40C (second notch section) is formed by selectively cutting the polymer actuator elements 441 and 442, from the end on the fixed side to the opposite side (to the normal direction of the X-axis), in the region between these fixed electrodes 440A and 440C. This makes it possible to supply the heating voltage Vh to the entire surface in each of the electrode films 52A and 52B of each of the polymer actuator elements 441 and 442 (from the fixed side along the movable side), while using the configuration of the fixed electrodes in the embodiment described above, like the example in FIG. 17A. In addition, compared to the example illustrated in FIG. 17A, the example illustrated in this FIG. 17B has such an advantage that the notch 40C is readily formed.

Furthermore, in the example illustrated in FIG. 17C, similarly, the pair of fixed electrodes 440A and 440C are provided on the fixing member 42 side (fixed side) on the electrode film 52B of each of the polymer actuator elements 441 and 442. On the electrode film 52B (52A), there is provided a wire (for example, a metal wire) 40W that establishes an electrical connection between the pair of fixed electrodes 440A and 440C from the fixed side via the opposite side (the movable side). This makes it possible to supply the heating voltage Vh to the entire surface in each of the electrode films 52A and 52B of each of the polymer actuator elements 441 and 442 (from the fixed side along the movable side), while using a configuration basically similar to that of the fixed electrodes in the embodiment described above. In addition, in the example illustrated in this FIG. 17C, heating efficiency may be improved and a structure in which the temperature is increased more easily is provided, compared to the examples illustrated in FIGS. 17A and 17B, when the same heating voltages Vh are used.

In this way, in the present modification, it is possible to supply the heating voltage Vh to the entire surface in each of the electrode films 52A and 52B of each of the polymer actuator elements 441 and 442 (from the fixed side along the movable side) and therefore, the whole elements may be heated. In addition, it is possible to realize a simplified configuration of the fixed electrodes, as compared to the technique of the modification 2 which will be described below.

[Modification 2]

Figure 18A:
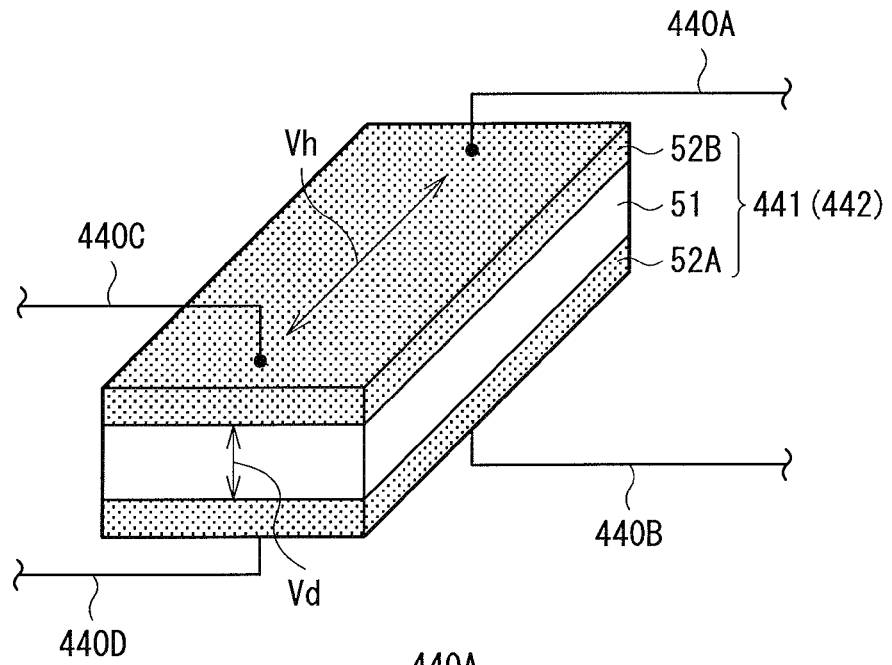
FIGS. 18A and 18B are schematic perspective diagrams for explaining a technique of applying a driving voltage and a heating voltage according to a modification 2.
Figure 18B:
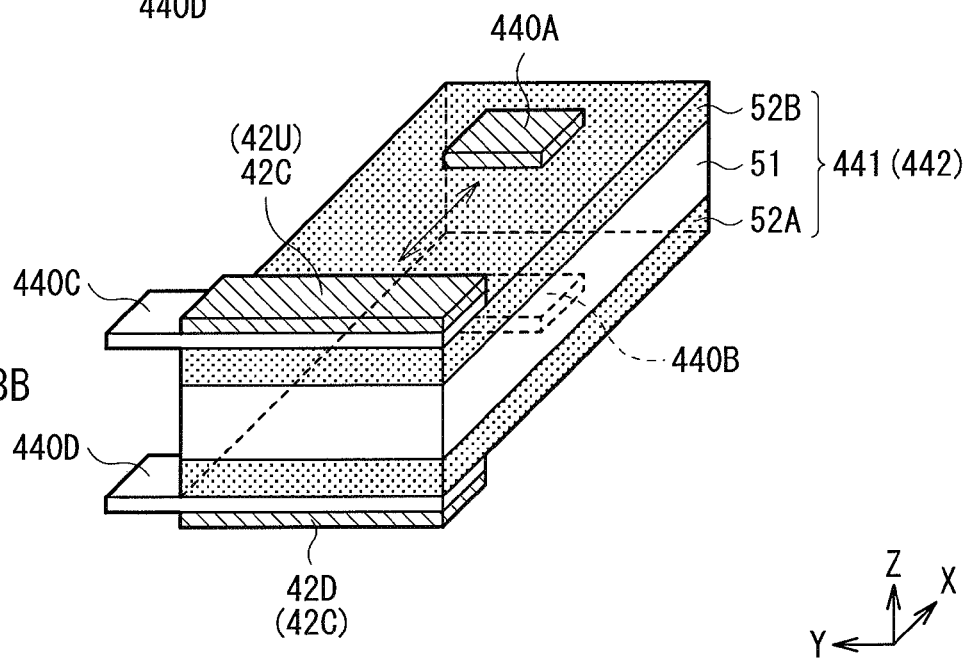

FIGS. 18A and 18B each illustrate the technique of applying the driving voltage Vd and the heating voltage Vh according to the modification 2, in a schematic perspective diagram. In the present modification, like the modification 1, the heating voltage Vh is supplied to the entire surface in each of electrode films 52A and 52B of each of polymer actuator elements 441 and 442 (from a fixed side along a movable side), while changing the configuration of the fixed electrodes in the embodiment and the modification 1 described above.

Specifically, as schematically illustrated in, for example, FIGS. 18A and 18B, the voltage supply section 451 of the present modification first supplies the driving voltage Vd between the pair of electrode films 52A and 52B in each of the polymer actuator elements 441 and 442, as in the embodiment described above. To be more specific, the voltage supply section 451 supplies the driving voltage Vd to each of between fixed electrodes 440A and 440B and between fixed electrodes 440C and 440D. Further, as in the embodiment described above, the voltage supply section 451 supplies the heating voltage Vh in an intra-film direction of each of the electrode films 52A and 52B in each of the polymer actuator elements 441 and 442. Specifically, the voltage supply section 451 supplies the heating voltage Vh to each of between the fixed electrodes 440A and 440C and between the fixed electrodes 440B and 440D.

However, unlike the embodiment described above, as indicated by an arrow in the figure, the voltage supply section 451 of the present modification supplies the heating voltage Vh from a region on the fixing member 42 side (a fixed side, or a root side) along the opposite side (a movable section side) in the polymer actuator elements 441 and 442 (here, along an X-axis direction). In other words, the voltage supply section 451 supplies the heating voltage Vh along a direction from the root side to the tip (in a length direction) of the polymer actuator elements 441 and 442. For this reason, in the present modification, only the fixed electrodes 440C and 440D are provided on a fixed section side, and the fixed electrodes 440A and 440B are provided on the movable section side (the tip side).

Thus, in the present modification, it is possible to supply the heating voltage Vh to the entire surface in each of the electrode films 52A and 52B of each of the polymer actuator elements 441 and 442 (from the fixed side along the movable side), as in the modification 1 described above.

Figures 19A, 19B:
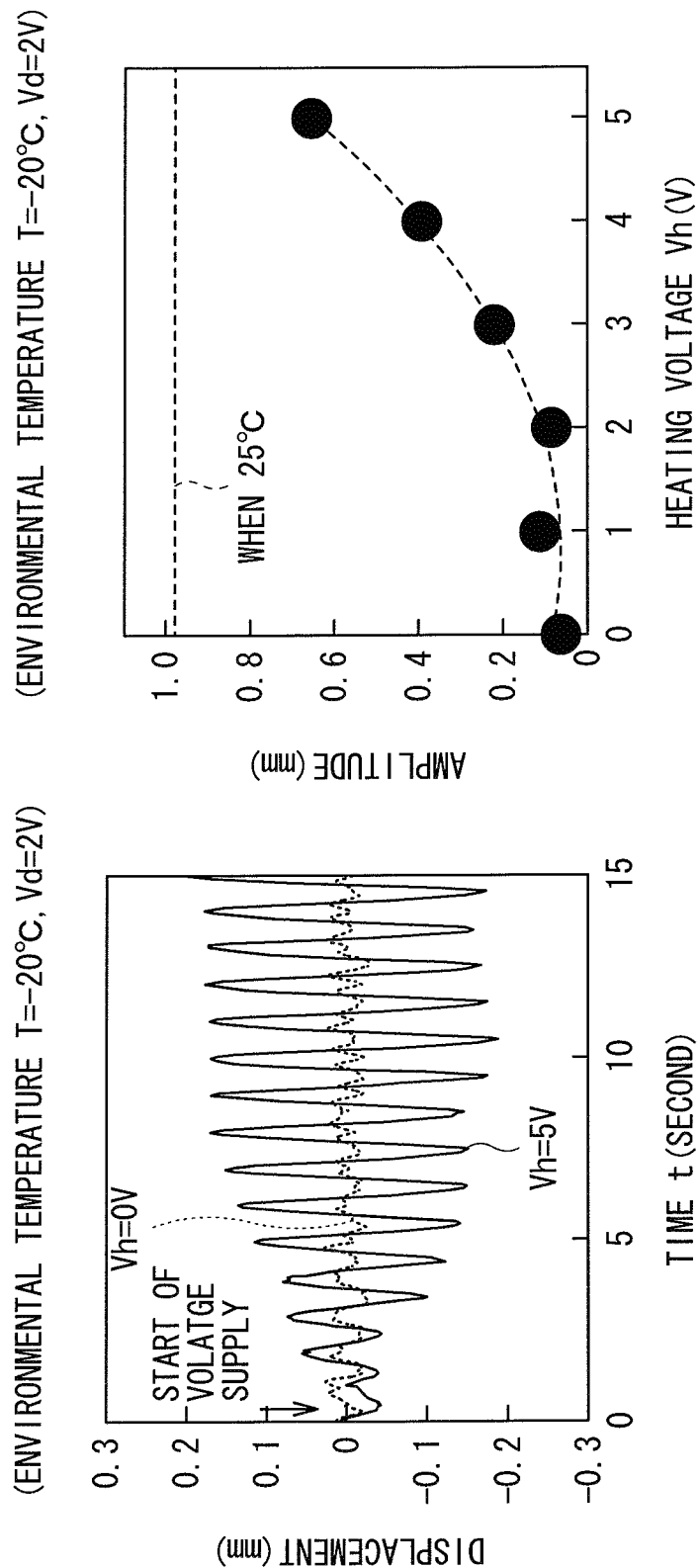
FIGS. 19A and 19B are characteristic diagrams illustrating an effect of applying a heating voltage according to an example of the modification 2.

FIGS. 19A and 19B illustrate an effect of applying the heating voltage Vh according to an example of the present modification. FIG. 19A illustrates a relationship between time (voltage application time) and the displacement of the polymer actuator elements 441 and 442, and FIG. 19B illustrates a relationship between the heating voltage Vh and the amplitude during the operation of the polymer actuator elements 441 and 442. It is to be noted that in this example, the environmental temperature T=−20° C., the driving voltage Vd=2 volts (±2 volts), and a frequency f of the driving voltage Vd=1 Hz. In addition, an arrow in FIG. 19A indicates the timing when the supply of the driving voltage Vd is started.

First, when a case where the heating voltage Vh=0 and a case where the heating voltage Vh=4 are compared to each other, it is found from FIG. 19A that supplying the heating voltage Vh=4 volts greatly increases the displacement of the polymer actuator elements 441 and 442, improving the characteristics in the low temperature environment. In addition, it is found from FIG. 19B that the amplitude of the polymer actuator elements 441 and 442 increases exponentially as the voltage value of this heating voltage Vh increases, improving the characteristics in the low temperature environment further.

In this way, in the present modification, it is possible to supply the heating voltage Vh to the entire surface in each of the electrode films 52A and 52B of each of the polymer actuator elements 441 and 442 (from the fixed side along the movable side) as well and thus, the whole elements may be heated.

[Modification 3]

Figure 20A:
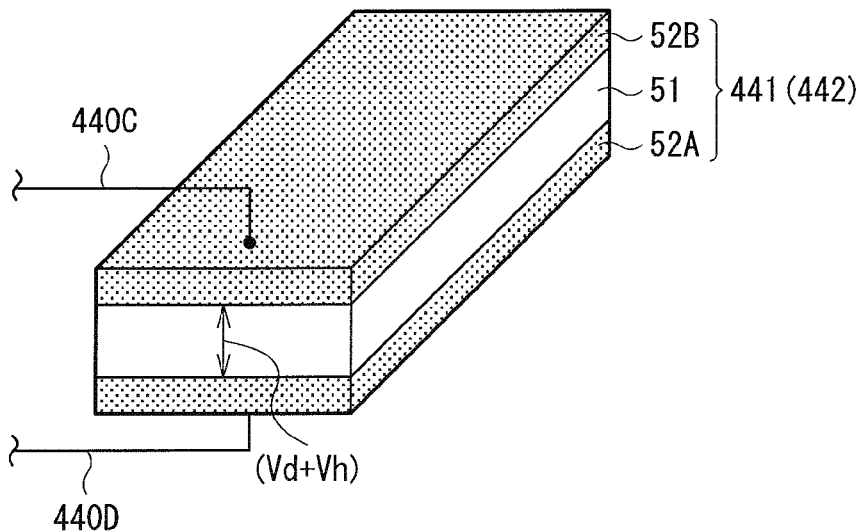
FIGS. 20A and 20B are schematic perspective diagrams for explaining a technique of applying a driving voltage and a heating voltage according to a modification 3.
Figure 20B:
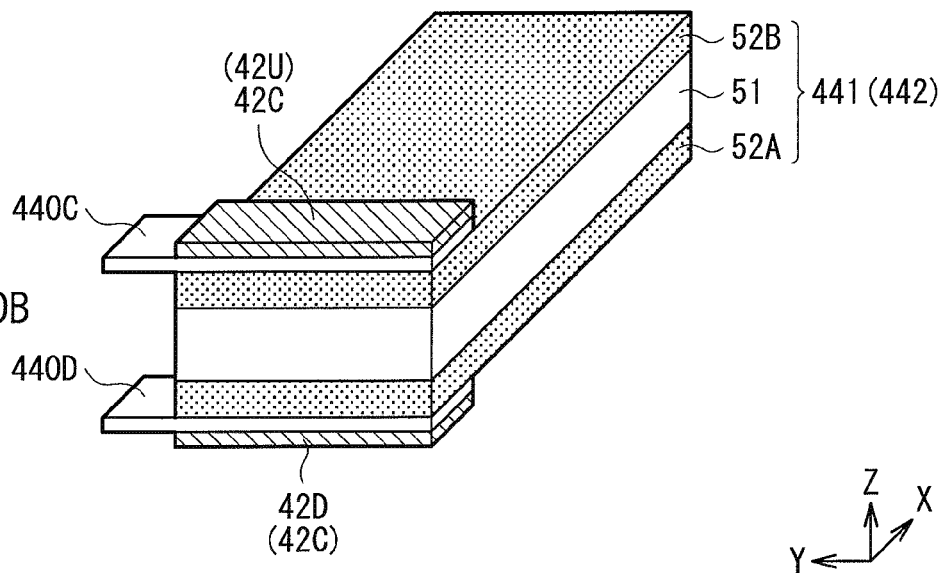

FIGS. 20A and 20B each illustrate a technique of applying a driving voltage Vd and a heating voltage Vh according to the modification 3, in a schematic perspective diagram. In the present modification, unlike the embodiment and the modifications 1 and 2 described so far, the heating voltage Vh is applied between electrode films 52A and 52B of each of polymer actuator elements 441 and 442.

Specifically, as schematically illustrated in FIGS. 20A and 20B, for example, a voltage supply section 451 of the present modification first supplies a driving voltage Vd between the pair of electrode films 52A and 52B in each of the polymer actuator elements 441 and 442, as in the embodiment and the like described above. Specifically, in the present modification, the voltage supply section 451 supplies the driving voltage Vd between fixed electrodes 440C and 440D.

However, unlike the embodiment and the like described above, as indicated with an arrow in the figure, the voltage supply section 451 of the present modification also supplies the heating voltage Vh, in addition to the driving voltage Vd, between the pair of electrode films 52A and 52B in each of the polymer actuator elements 441 and 442. Specifically, in the present modification, the voltage supply section 451 also supplies the heating voltage Vh between the fixed electrodes 440C and 440D. In this way, in the present modification, both the driving voltage Vd and the heating voltage Vh are supplied between the pair of electrode films 52A and 52B in each of the polymer actuator elements 441 and 442.

Figure 21A:
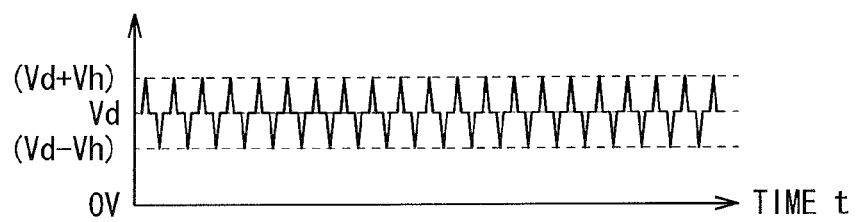
FIGS. 21A and 21B are timing charts each illustrating a waveform example of the driving voltage and the heating voltage according to the modification 3.
Figure 21B:
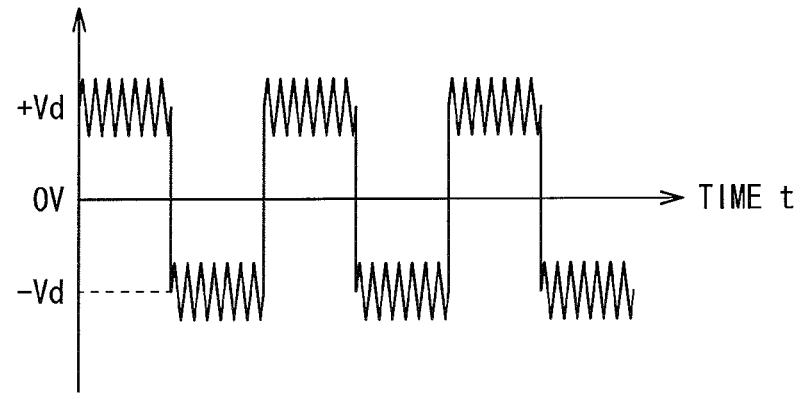

To be more specific, as illustrated in each of FIGS. 21A and 21B, for example, the voltage supply section 451 supplies the heating voltage Vh and the driving voltage Vd by superimposing the heating voltage Vh of a high-frequency AC voltage (for example, around 1 kHz) on the driving voltage Vd of a DC voltage or an AC voltage.

Thanks to such a configuration, in the present modification, the heating voltage Vh of the high frequency on a level that does not allow the polymer actuator elements 441 and 442 to follow (deform) is superimposed on the driving voltage Vd and thus, it is possible to obtain effects similar to those in the embodiment and the like described above. In other words, it is possible to increase the temperature of the element through heat generation by the polymer actuator elements 441 and 442 themselves, and improve the displacement or the working speed of the elements in the low temperature environment, without providing an external dedicated heat source separately. Therefore, it is possible to improve the characteristics in the low temperature environment while reducing the size (weight). In addition, in the present modification in particular, as illustrated in FIGS. 20A and 20B, only the two fixed electrodes 440C and 440D may be provided and thus, implementation with a more simple configuration is possible, and further downsizing (weight reduction) is allowed, as compared to the above-described embodiment and the like in which the four fixed electrodes 440A, 440B, 440C, and 440D are provided.

[Other Modifications]

The present technology has been described by using the embodiment and the modifications, but the present technology is not limited to these embodiment and the like and may be variously modified.

For example, the technique of supplying the driving voltage Vd and the heating voltage Vh and their waveforms and the like are not limited to those described in the embodiment and the like, and other techniques and waveforms may be employed. In addition, as the voltage supply section 451 described in the embodiment and the like, a part supplying the driving voltage Vd and a part supplying the heating voltage Vh may be provided separately, or the parts supplying these two types of voltage may be commonized (unified) and provided. However, when the part supplying the driving voltage Vd and the part supplying the heating voltage Vh are provided separately, it is desirable to provide a driving electrode and a heating electrode separately. This is because if these electrodes are commonized, independent voltages may not be supplied.

Further, the embodiment and the like have been described for the case where the pair of polymer actuator elements are provided, but the polymer actuator elements may not be a pair, and one or three or more polymer actuator elements may be provided.

Furthermore, the shape of the polymer actuator element is not limited to that in each of the embodiment and the like and also, the layered structure thereof is not limited to that described in each of the embodiment and the like and may be modified as appropriate. In addition, the shape, material, and the like of each member in the lens module (driving unit) are not limited as well to those described in the embodiment and the like.

Moreover, the embodiment and the like have been described by taking the lens driving unit that drives the lens along the optical axis as an example of the driving unit according to the embodiment of the present disclosure, but the driving unit is not limited to this case. In other words, the driving unit according to the embodiment of the present disclosure is applicable to, for example, a driving unit that drives a diaphragm or the like (see Japanese Unexamined Patent Application Publication No. 2008-259381 and the like), other than such a lens driving unit. In addition, the driving unit, the lens module, and the image pickup device according to the embodiment of the present disclosure are applicable to various kinds of electronic device, other than the portable telephone described in the above embodiment and the like.

The present disclosure contains subject matter related to that disclosed in Japanese Priority Patent Application JP 2010-181716 filed in the Japan Patent Office on Aug. 16, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A driving unit comprising:
one or more polymer actuator elements comprising, respectively, a polymer material;
a voltage supply section configured to supply a driving voltage and a heating voltage, distinct from the driving voltage, to at least one of the one or more polymer actuator elements, wherein a first polymer actuator element of the one or more polymer actuator elements includes a pair of electrode films, and wherein the polymer material of the first polymer actuator element comprises a polymer film between the pair of electrode films;
a first electrode pair having first and second electrodes disposed on respective electrode films of the pair of electrode films; and
a second electrode pair having first and second electrodes disposed on respective electrode films of the pair of electrode films and spaced from the first electrode pair, wherein the voltage supply section supplies the driving voltage between the first and second electrodes of the first electrode pair and between the first and second electrodes of the second electrode pair, and wherein the voltage supply section supplies the heating voltage between the first electrodes of the first and second electrode pairs and between the second electrodes of the first and second electrode pairs.

2. The driving unit according to claim 1, wherein the voltage supply section is configured to supply the heating voltage in an intra-film direction of each of the electrode films.

3. The driving unit according to claim 2, further comprising:
a fixing member fixing one end of the first polymer actuator element.

4. The driving unit according to claim 3, wherein the voltage supply section is configured to supply the heating voltage selectively to a region on the fixing member side in the first polymer actuator element.

5. The driving unit according to claim 3, further comprising:
a plurality of fixed electrodes disposed on the fixing member side on each of the electrode films, the voltage supply section configured to supply the plurality of fixed electrodes with the heating voltage,
wherein the first polymer actuator element has a first notch section formed from an end on the fixing member side in a region between the plurality of fixed electrodes toward an opposite side thereof, by cutting each film.

6. The driving unit according to claim 3, further comprising:
a plurality of fixed electrodes disposed on the fixing member side on each of the electrode films, the voltage supply section configured to supply the plurality of fixed electrodes with the heating voltage,
wherein the first polymer actuator element has a second notch section formed from an end on the fixing member side in a region between the plurality of fixed electrodes toward an opposite side thereof, by cutting the pair of electrode films selectively.

7. The driving unit according to claim 3, further comprising:
a plurality of fixed electrodes disposed on the fixing member side on each of the electrode films, the voltage supply section configured to supply the plurality of fixed electrodes with the heating voltage; and
a wiring making an electrical connection between the plurality of fixed electrodes, from the fixing member side via an opposite side thereof.

8. The driving unit according to claim 3, wherein the voltage supply section is configured to supply the heating voltage from the fixing member side along an opposite side thereof, in the first polymer actuator element.

9. The driving unit according to claim 1, wherein the voltage supply section is configured to supply both the driving voltage and the heating voltage between the pair of electrode films.

10. The driving unit according to claim 9, wherein the voltage supply section is configured to supply a heating voltage of a high-frequency alternating current voltage, superimposed on the driving voltage.

11. The driving unit according to claim 1, wherein the heating voltage is an alternating current voltage.

12. The driving unit according to claim 1, further comprising:
a control section configured to determine whether or not to supply the heating voltage, as well as a magnitude and a waveform of a heating voltage to be supplied, based on an environmental temperature detected directly or indirectly.

13. The driving unit according to claim 1, wherein the driving unit is configured as a lens driving unit driving a lens.

14. The driving unit according to claim 3, wherein the first polymer actuator element includes a fixed side and a movable side and wherein the first and second electrode pairs are disposed on respective electrode films of the pair of electrode films on the fixed side of the first polymer actuator element.

15. A lens module comprising:
a lens; and
a driving unit driving the lens,
wherein the driving unit includes one or more polymer actuator elements comprising, respectively, a polymer material, a voltage supply section configured to supply a driving voltage and a heating voltage, distinct from the driving voltage, to at least one of the one or more polymer actuator elements, wherein a first polymer actuator element of the one or more polymer actuator elements includes a pair of electrode films, and wherein the polymer material of the first polymer actuator element comprises a polymer film between the pair of electrode films;

a first electrode pair having first and second electrodes disposed on respective electrode films of the pair of electrode films; and a second electrode pair having first and second electrodes disposed on respective electrode films of the pair of electrode films and spaced from the first electrode pair, wherein the voltage supply section supplies the driving voltage between the first and second electrodes of the first electrode pair and between the first and second electrodes of the second electrode pair, and wherein the voltage supply section supplies the heating voltage between the first electrodes of the first and second electrode pairs and between the second electrodes of the first and second electrode pairs.

16. The lens module according to claim 15, wherein the first polymer actuator element includes a fixed side and a movable side and wherein the first and second electrode pairs are disposed on respective electrode films of the pair of electrode films on the fixed side of the first polymer actuator element.

17. An image pickup device comprising:
a lens;
an image pickup element acquiring an image pickup signal of image formation by the lens; and
a driving unit driving the lens,
wherein the driving unit includes
one or more polymer actuator elements comprising, respectively, a polymer material, a voltage supply section configured to supply a driving voltage and a heating voltage, distinct from the driving voltage, to at least one of the one or more polymer actuator elements, wherein a first polymer actuator element of the one or more polymer actuator elements includes a pair of electrode films, and wherein the polymer material of the first polymer actuator element comprises a polymer film between the pair of electrode films;

a first electrode pair having first and second electrodes disposed on respective electrode films of the pair of electrode films; and a second electrode pair having first and second electrodes disposed on respective electrode films of the pair of electrode films and spaced from the first electrode pair, wherein the voltage supply section supplies the driving voltage between the first and second electrodes of the first electrode pair and between the first and second electrodes of the second electrode pair, and wherein the voltage supply section supplies the heating voltage between the first electrodes of the first and second electrode pairs and between the second electrodes of the first and second electrode pairs.

18. The image pickup device according to claim 17, wherein the first polymer actuator element includes a fixed side and a movable side and wherein the first and second electrode pairs are disposed on respective electrode films of the pair of electrode films on the fixed side of the first polymer actuator element.

* * * * *